US007855346B2

(12) United States Patent
Okada

(10) Patent No.: US 7,855,346 B2
(45) Date of Patent: Dec. 21, 2010

(54) DATA PROCESSING APPARATUS AND REMOVAL RECORDING MEDIA

(75) Inventor: Yasushi Okada, Hatano (JP)

(73) Assignee: Ricoh Company, Ltd., Tokyo (JP)

( * ) Notice: Subject to any disclaimer, the term of this patent is extended or adjusted under 35 U.S.C. 154(b) by 545 days.

(21) Appl. No.: 11/898,706

(22) Filed: Sep. 14, 2007

(65) Prior Publication Data

US 2008/0068787 A1 Mar. 20, 2008

(30) Foreign Application Priority Data

Sep. 15, 2006 (JP) ............................ 2006-251835

(51) Int. Cl.
*H05K 5/02* (2006.01)

(52) U.S. Cl. ................. 200/333; 200/50.1; 361/679.31; 361/697.32; 361/679.57; 361/679.58; 358/296; 358/302

(58) Field of Classification Search ............ 361/679.31, 361/679.32, 679.43; 200/50.1
See application file for complete search history.

(56) References Cited

U.S. PATENT DOCUMENTS

| | | | | |
|---|---|---|---|---|
| 3,781,495 | A * | 12/1973 | Splingaerd | 200/50.1 |
| 4,397,511 | A * | 8/1983 | Clark et al. | 361/679.31 |
| 5,351,228 | A * | 9/1994 | Kanno et al. | 720/647 |
| 5,574,625 | A * | 11/1996 | Ohgami et al. | 361/679.09 |
| 5,831,613 | A * | 11/1998 | Johnston et al. | 715/771 |
| 5,848,904 | A * | 12/1998 | Kikuchi | 439/136 |
| 5,875,063 | A * | 2/1999 | Corrington et al. | 360/71 |
| 5,991,530 | A * | 11/1999 | Okada et al. | 703/25 |
| 6,012,114 | A * | 1/2000 | Autor et al. | 710/302 |
| 6,267,608 | B1 * | 7/2001 | Yagi | 439/142 |
| 6,338,536 | B1 * | 1/2002 | Ueno et al. | 312/405 |
| D466,086 | S * | 11/2002 | Metcalf | D13/152 |
| 6,486,419 | B2 * | 11/2002 | Horiguchi et al. | 200/43.19 |
| 6,529,382 | B2 * | 3/2003 | Terao | 361/726 |
| 6,661,539 | B1 * | 12/2003 | Nee | 358/474 |
| 7,052,097 | B2 * | 5/2006 | Meek et al. | 312/222 |
| 7,123,487 | B2 * | 10/2006 | Saito et al. | 361/801 |
| 7,233,489 | B2 * | 6/2007 | Toyama et al. | 361/679.31 |
| 7,234,013 | B2 * | 6/2007 | Ortiz et al. | 710/302 |
| 7,242,577 | B2 * | 7/2007 | Sween et al. | 312/223.2 |
| 7,291,784 | B2 * | 11/2007 | Moore et al. | 174/50 |

(Continued)

FOREIGN PATENT DOCUMENTS

| | | |
|---|---|---|
| JP | 04-137594 | 5/1992 |

(Continued)

*Primary Examiner*—Jayprakash N Gandhi
*Assistant Examiner*—Anthony Q Edwards
(74) *Attorney, Agent, or Firm*—Harness, Dickey & Pierce, P.L.C.

(57) ABSTRACT

A data processing apparatus includes a manipulation member, a protection cover, a latch member, a coupling device, and a control unit. The protection cover covers a removable recording medium attached to the data processing apparatus. The latch member engages the protection cover to set the protection cover in a closed condition. The coupling device couples or uncouples the manipulation member and the latch member. The control unit controls a coupling condition of the manipulation member and the latch member. The control unit selectively transmits a first signal for coupling the manipulation member and the latch member and a second signal for uncoupling the manipulation member and the latch member depending on whether or not data processing for the removable recording medium is in progress.

8 Claims, 19 Drawing Sheets

U.S. PATENT DOCUMENTS

| | | | | |
|---|---|---|---|---|
| 7,347,712 | B2 * | 3/2008 | O'Connell et al. | 439/373 |
| 7,443,660 | B2 * | 10/2008 | Mayuzumi | 361/679.55 |
| 7,495,900 | B2 * | 2/2009 | Shi et al. | 361/679.02 |
| 7,637,755 | B2 * | 12/2009 | Hondo et al. | 439/142 |
| 7,638,962 | B2 * | 12/2009 | Cardwell | 318/484 |
| 7,679,897 | B2 * | 3/2010 | Xu et al. | 361/679.37 |
| 2001/0013742 | A1 * | 8/2001 | Lu | 312/223.2 |
| 2002/0075657 | A1 * | 6/2002 | Terao | 361/726 |
| 2004/0136158 | A1 * | 7/2004 | Ohmori | 361/684 |
| 2005/0122674 | A1 * | 6/2005 | Szolyga et al. | 361/685 |
| 2005/0213295 | A1 * | 9/2005 | Perez et al. | 361/683 |
| 2006/0245159 | A1 * | 11/2006 | Lin et al. | 361/685 |
| 2007/0074233 | A1 * | 3/2007 | Moriya et al. | 720/647 |
| 2007/0170254 | A1 * | 7/2007 | Ishihara et al. | 235/439 |
| 2008/0037202 | A1 * | 2/2008 | Shinohara et al. | 361/679 |
| 2008/0106870 | A1 * | 5/2008 | Dully | 361/724 |

FOREIGN PATENT DOCUMENTS

| | | |
|---|---|---|
| JP | 2002-300334 | 10/2002 |
| JP | 2004-356822 | 12/2004 |
| JP | 2006-135462 | 5/2006 |

* cited by examiner

DATA PROCESSING APPARATUS AND REMOVAL RECORDING MEDIA

PRIORITY STATEMENT

The present patent application claims priority under 35 U.S.C. §119 upon Japanese patent application No. 2006-251835 filed on Sep. 15, 2006 in the Japan Patent Office, the entire contents of which is hereby incorporated by reference herein.

TECHNICAL FIELD

The present disclosure relates generally to a data processing apparatus having an enhanced usability of a removable recording medium.

BACKGROUND

Portable recording media (or removable memory media) have become a popular recording device for recording or storing document data, image data or the like. Such recording media (or removable memory medium) include smart medium, DVD (digital versatile disk), CD-R (compact disc recordable), CD-RW (compact disc rewritable), compact flash (registered trademark), multi-media card (MMC), SD (secure digital) card, and memory stick, for example. Further, such recording media can be connected to a medium interface unit of an image processing apparatus placed in public locations such as convenience stores, by which image data stored in such recording media can be read and printed.

Such image processing apparatus may have a protection cover for the medium interface unit to prevent dropping-out or removal of a recording medium from the image processing apparatus during data transmission between the recording medium and image processing apparatus.

For example, an image processing apparatus may have a connection port and a protection cover, in which a recording medium, storing image data captured by an image capturing apparatus (e.g., digital camera), is inserted in the connection port for data transmission. Such image processing apparatuses include a digitally-controlled apparatus having a copy function, a facsimile function, a print function, and a scan function, for example.

Such image processing apparatus may also have a memory medium reader or a memory medium writer having a connector, to which the above-mentioned portable recording medium can be connected.

The image processing apparatus can read information stored in the portable recording medium with the memory medium reader, and can print out an image of such read information, or the image processing apparatus can store document data, scanned by scanning function, to the portable recording medium by using a memory medium writer, for example.

In such image forming apparatus, a user can remove such portable recording medium from the connector of the memory medium reader or the memory medium writer by hand, for example. However, if the portable recording medium is removed from the connector during data processing such as data reading or data writing by accident or mistake, the data might be damaged or OS (operating system) trouble might occur.

As described above, a protection cover may be provided to a medium interface unit to prevent accidental removal of the recording medium or to keep the recording medium from falling out of the apparatus. However, if such cover is opened by mistake or for some other reason, the recording medium can be easily removed from the connector during data processing, which is undesirable.

SUMMARY

An embodiment of the present invention provides a data processing apparatus including a manipulation member, a protection cover, a latch member, a coupling device, and a control unit. The protection cover covers a removable recording medium attached to the data processing apparatus. The latch member engages the protection cover to set the protection cover in a closed condition. The coupling device couples or uncouples the manipulation member and the latch member. The control unit controls a coupling condition of the manipulation member and the latch member. The control unit selectively transmits a first signal for coupling the manipulation member and the latch member and a second signal for uncoupling the manipulation member and the latch member depending on whether or not data processing for the removable recording medium is in progress.

An embodiment of the present invention also provides a data processing apparatus including a protection, a latch member, and a control unit. The protection cover covers a removable recording medium attached to the data processing apparatus, and has a receiving portion. The latch member engages the receiving portion of the protection cover to set the protection cover in a closed condition. The control unit controls a coupling condition of the latch member and the receiving portion of the protection cover. The control unit selectively transmits a first signal for engaging the latch member and the receiving portion and a second signal for disengaging the latch member and the receiving portion depending on whether or not data processing for the removable recording medium is in progress.

An embodiment of the present invention also provides a data processing apparatus including a protection cover, a latch member, a biasing member, a latch member stopper, and a guiding unit. The protection cover covers a removable recording medium attached to the data processing apparatus, and has a receiving portion. The latch member engages the receiving portion of the protection cover to set the protection cover in a closed condition. The biasing member biases the latch member toward the receiving portion of the protection cover to engage the latch member to the receiving portion. The latch member stopper stops a movement of the latch member biased by the biasing member at an engaging position with the receiving portion of the protection cover. The guiding unit guides the latch member when engaging the latch member to the receiving portion of the protection cover, and guides the latch member when disengaging the latch member from the receiving portion of the protection cover.

BRIEF DESCRIPTION OF THE DRAWINGS

A more complete appreciation of the disclosure and many of the attendant advantages and features thereof can be readily obtained and understood from the following detailed description with reference to the accompanying drawings, wherein.

Figure 1:
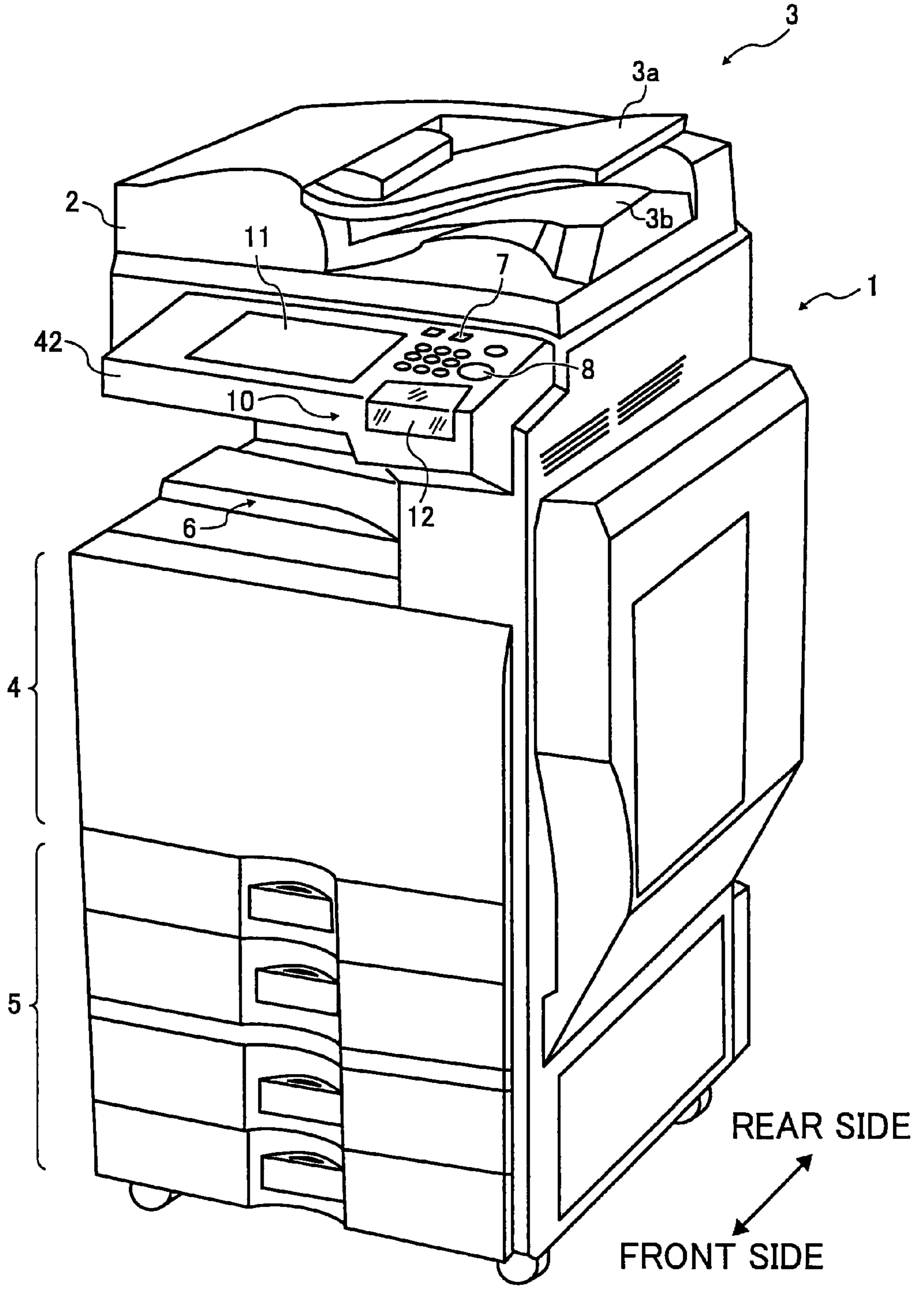
FIGS. 1 and 2 show perspective views of an image processing apparatus according to an example embodiment.

The accompanying drawings are intended to depict example embodiments of the present disclosure and should not be interpreted to limit the scope thereof. The accompanying drawings are not to be considered as drawn to scale unless explicitly noted.

DETAILED DESCRIPTION OF EXAMPLE EMBODIMENTS

It will be understood that if an element or layer is referred to as being "on," "against," "connected to" or "coupled to" another element or layer, then it can be directly on, against connected or coupled to the other element or layer, or intervening elements or layers may be present. In contrast, if an element is referred to as being "directly on", "directly connected to" or "directly coupled to" another element or layer, then there is no intervening elements or layers present.

Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present invention is not intended to be limited to the specific terminology so selected and it is to be understood that each specific element includes all technical equivalents that operate in a similar manner.

Figure 2:
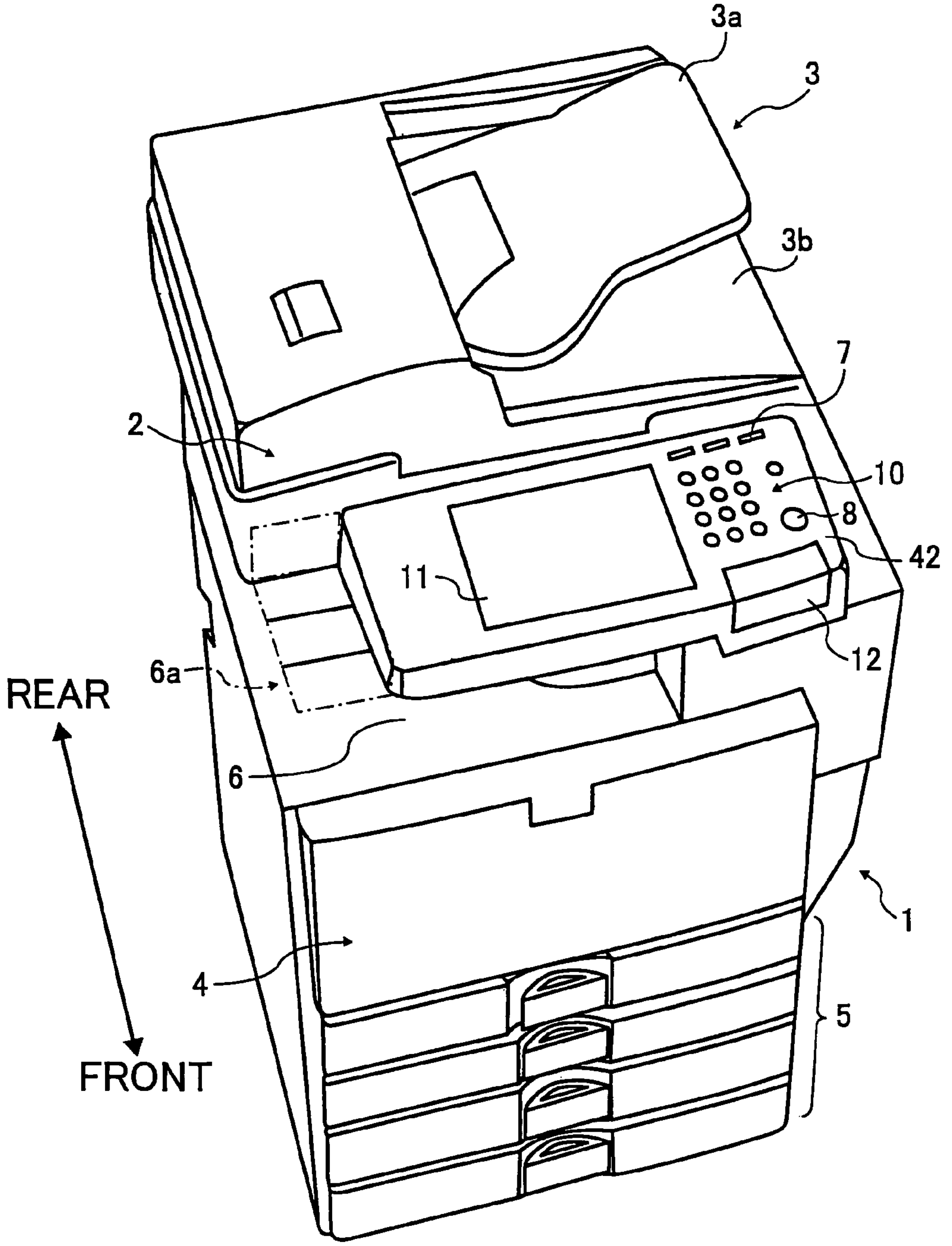

Referring now to the drawings, wherein like reference numerals designate identical or corresponding parts throughout the several views, an image processing apparatus according to an example embodiment is described with particular reference to FIGS. 1 and 2.

FIGS. 1 and 2 show perspective views of an image processing apparatus 1 according to an example embodiment. The image processing apparatus 1 may be a multifunctional apparatus having copy/facsimile/print/scanning function, and may be a digitally controlled apparatus, for example.

As shown in FIG. 1, the image processing apparatus 1 includes a scanner 2, an automatic document feeder 3, a printing unit 4, and a sheet feed unit 5, for example. The scanner 2 and the automatic document feeder 3 are disposed on a top portion of the image processing apparatus 1, for example.

Document sheets placed on a document tray 3*a* of the automatic document feeder 3 is fed to the scanner 2 automatically, and ejected to a document ejection tray 3*b*. Then, document information scanned by the scanner 2 can be printed on a sheet medium with the printing unit 4, and the sheet medium having a printed image is ejected to a sheet ejection tray 6, or scanned document information is transmitted to a desired destination by a facsimile function, for example.

The sheet feed unit 5, disposed at a lower portion of the image processing apparatus 1, includes a plurality of sheet containers for containing a plurality of types of sheet media. The sheet feed unit 5 feeds such sheet media to the printing unit 4 at a given timing.

In the image forming apparatus 1, the scanner 2 and the automatic document feeder 3 may be configured as one integral unit, for example. The scanner 2 has a scanning device to scan document information by irradiating a light beam to document, and an image pickup device to obtain such document information. Such document information is printed on a sheet medium by the printing unit 4 as above-mentioned.

As shown in FIG. 1, the image processing apparatus 1 also includes an operation unit 10 on its front side, which is used for inputting information to the image processing apparatus 1, for example.

The operation unit 10 includes an operation key 7, a switch button 8 provided for operating the image processing apparatus 1. The operation unit 10 also includes a display panel 11 having a touch key, which is used to display information thereon of the image processing apparatus 1 and to input information to the image processing apparatus 1. Further, the operation unit 10 includes a protection cover 12 for covering or protecting a portable recording medium, wherein such protection cover 12 can be opened as described later.

As shown in FIG. 2, a user can see a sheet ejection confirmation area 6*a* of the sheet ejection tray 6 when the user stands at a front side (e.g. operation unit 10) of the image processing apparatus 1.

Figure 3:
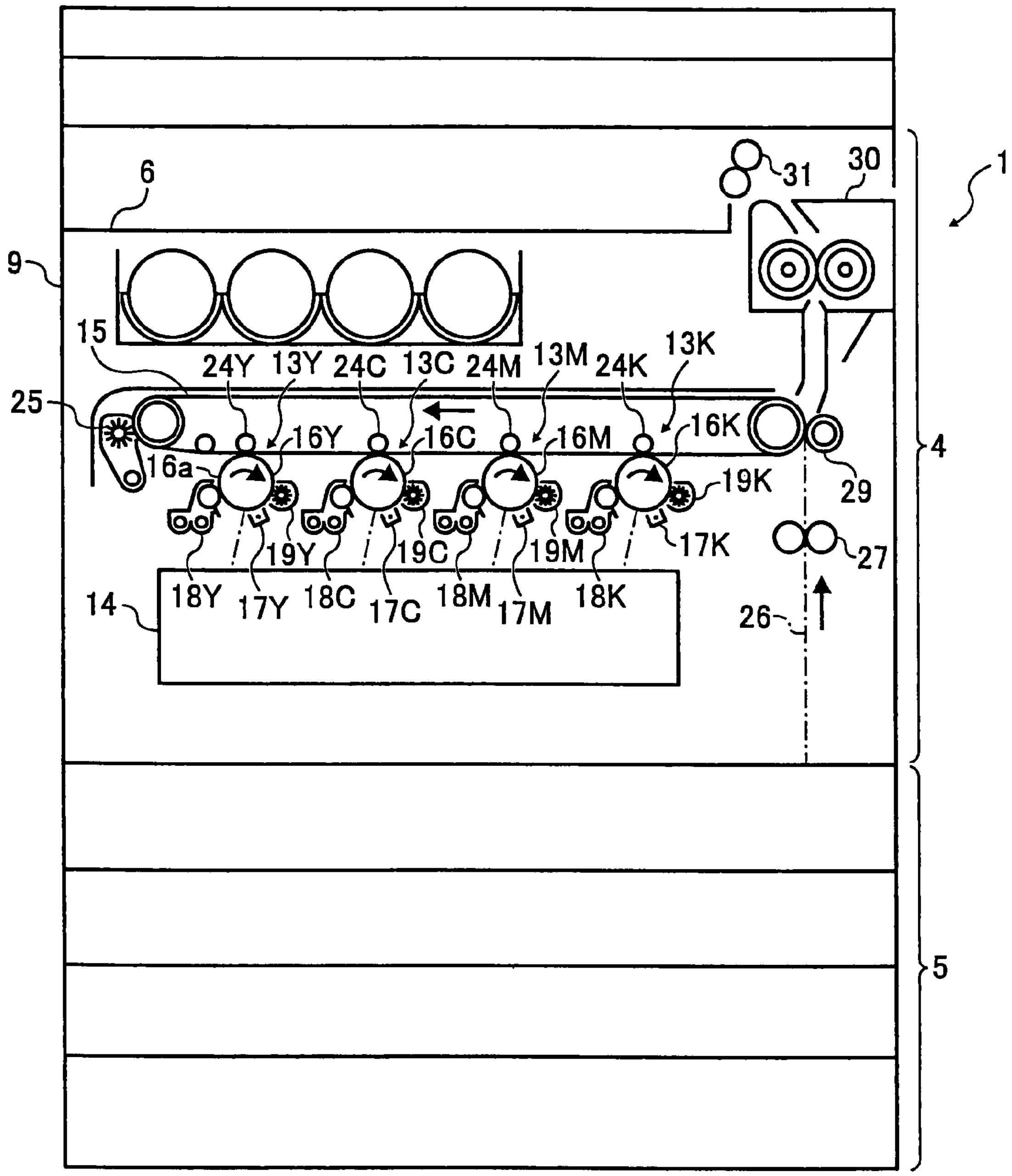
FIG. 3 shows a schematic cross-sectional view of a printing unit in the image processing apparatus of FIG. 1.

The printing unit 4 provided in a housing 9 conducts an image forming by electrophotography, for example. As shown in FIG. 3, the printing unit 4 may include image forming units 13Y, 13C, 13M, and 13K, an optical writing unit 14, and an intermediate transfer belt 15, for example.

The image forming units 13Y, 13C, 13M, and 13K are used to form toner images of yellow, cyan, magenta, and black, respectively. Hereinafter, Y, C, M, and K represent color of yellow, cyan, magenta, and black, respectively, in this disclosure.

Because the image forming units 13Y, 13C, 13M, and 13K have a similar configuration one to another except toner color, reference characters of Y, C, M, and K may be omitted in following description. As shown in FIG. 3, the image forming unit 13 includes a photoconductor 16, a charger 17, a developing unit 18, a cleaning unit 19, for example.

The photoconductor 16 having a drum shape may rotate in a direction shown by an arrow with a driving unit (not shown). The photoconductor 16 has a surface 16*a* having a photosensitive layer, which is scanned by a light beam irradiated from the optical writing unit 14. The optical writing unit 14 irradiates a light beam to the surface 16*a* of the photoconductor 16 to write an electrostatic latent image on the photoconductor 16 based on image information scanned by the scanner 2.

The charger 17 uniformly charges the surface 16*a* of photoconductor 16, wherein the charger 17 employs a non-contact type, for example.

The developing unit 18 supplies toner to the photoconductor 16 to develop the electrostatic latent image on the surface 16*a* of photoconductor 16 as toner image, wherein the developing unit 18 has a given gap with the surface 16*a* of the photoconductor 16.

The cleaning unit 19 removes toner remaining on the surface 16*a* of the photoconductor 16. Such cleaning unit 19 employs a brush contact type, in which a cleaning brush may contact the surface 16*a* of the photoconductor 16.

The intermediate transfer belt 15 may be an endless belt made of resin or rubber, to which a toner image is transferred from the photoconductor 16. The intermediate transfer belt 15 is extended by rollers, and travels in a direction shown by an arrow in FIG. 3.

As shown in FIG. 3, four transfer rollers 24 are disposed inner face of the intermediate transfer belt 15 to transfer a toner image from the photoconductor 16 to the intermediate transfer belt 15. Such four transfer rollers 24 presses the intermediate transfer belt 15 toward the photoconductor 16. A belt cleaning unit 25 shown in FIG. 3 is used to remove toner or paper dust remaining on the intermediate transfer belt 15.

The sheet feed unit 5 feeds a sheet medium to a sheet transport route 26, and the sheet media is further transported to a registration roller 27, an intermediate transfer roller 29, a fusing unit 30, and an ejection roller 31.

The registration roller 27 stops a sheet medium transported from the transport route 26 temporarily. Such registration roller 27 rotates for a given time to feed the sheet media to a transfer nip between the intermediate transfer belt 15 and the intermediate transfer roller 29. In such transfer nip, a toner image is transferred from the intermediate transfer belt 15 to the sheet medium.

The fusing unit 30 applies heat and pressure to the sheet medium to fuse the toner image on the sheet medium, and then the sheet medium having the fused toner image is ejected to a sheet ejection tray 6 by an ejection roller 31.

Figure 4:
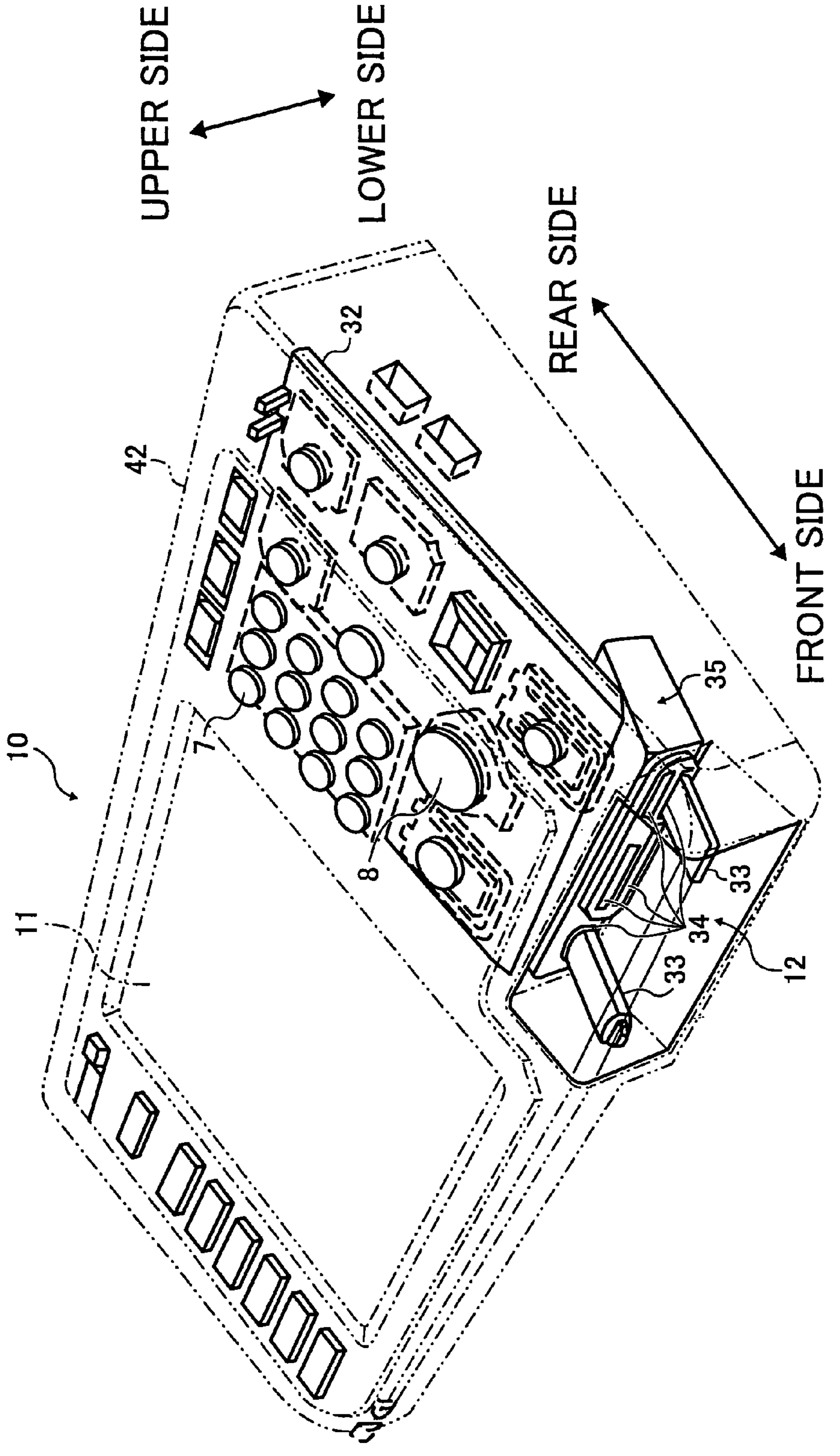
FIG. 4 shows a perspective view of an operation unit of the image processing apparatus of FIG. 1.
Figure 5:
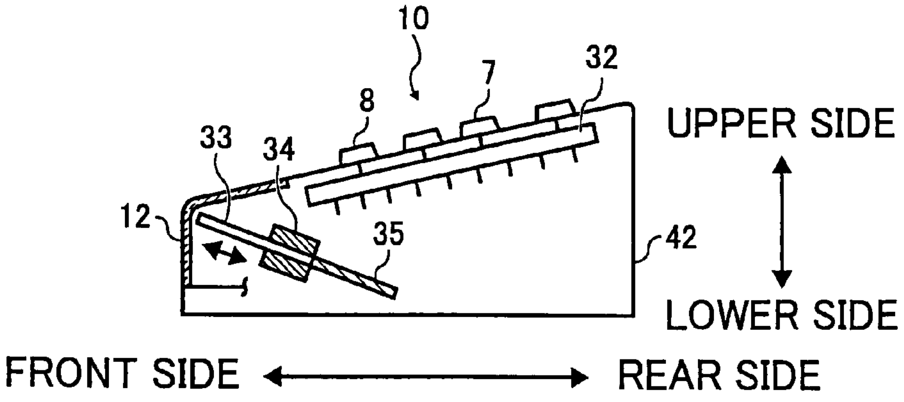
FIG. 5 shows a schematic cross-sectional view of the operation unit of FIG. 4.

FIGS. 4 and 5 show the operation unit 10, which can be operated by a user. The operation unit 10 includes the operation key 7 to set conditions such as number of copying, for example. The operation unit 10 also includes an operation board 32 under the operation key 7 to detect a pushing operation of the operation key 7.

Such operation board 32 may be slanted in one direction. For example, as shown in FIG. 5, a front side of the operation board 32 is positioned lower than a rear side of the operation board 32 so that a user can operate the operation unit 10 easily.

Further, the operation unit 10 includes a memory medium reader 35 having a connector 34 under the operation board 32. A portable recording medium 33 can be removeably attached to the connector 34 of the memory medium reader 35.

In FIG. 5, a front side of the memory medium reader 35 is positioned higher than a rear side of the memory medium reader 35.

Figure 6:
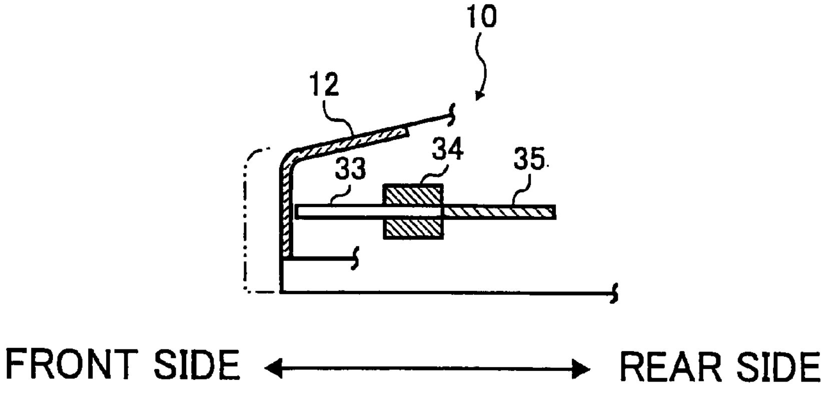
FIGS. 6 and 7 show another schematic cross-sectional views of the operation unit of FIG. 4.

As shown in FIG. 6, under the operation board 32, a front side of the memory medium reader 35 can be positioned at a same level of a rear side of the memory medium reader 35 in a horizontal direction, in which the connector 34 is positioned in a horizontal direction. In such configuration, the operation unit 10 may need a space (shown by dotted line in FIG. 6) in a front side depending on a positional relationship (e.g., interference of parts) of the memory medium reader 35 and the operation board 32 in the operation unit 10.

Figure 7:
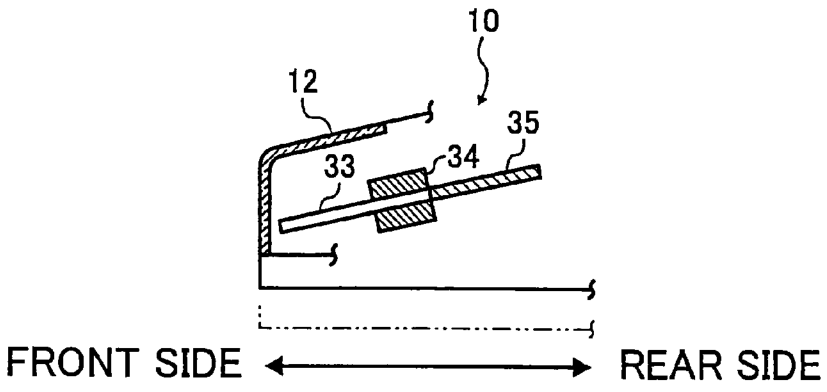

As shown in FIG. 7, a front side of the memory medium reader 35 can be positioned lower than a rear side of the memory medium reader 35. However, such memory medium reader 35 has the connector 34 facing the lower direction, by which a user cannot attach the portable recording medium 33 to the connector 34 easily.

Although the image processing apparatus 1 has the memory medium reader 35 in the operation unit 10, a memory medium writer can be disposed in the operation unit 10 in a similar manner. For the simplicity of illustration and description, the memory medium reader 35 may be used in this disclosure as a representative of a memory medium reader and a memory medium writer.

In a configuration shown in FIG. 5, the operation unit 10 can be effectively miniaturized because an interference between the memory medium reader 35 and the operation board 32 can be prevented without allocating a greater space between the memory medium reader 35 and the operation board 32.

Figure 8:
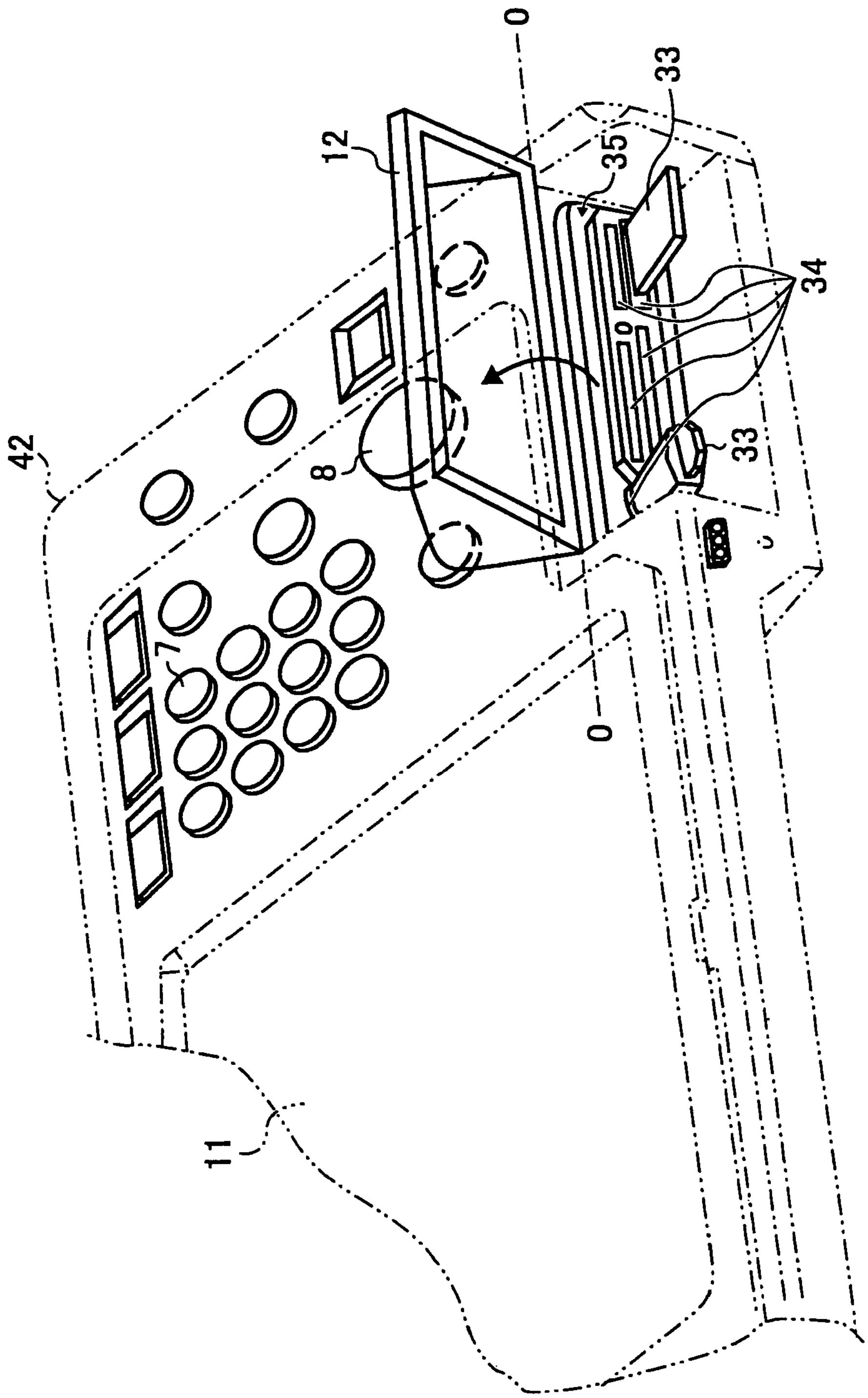
FIG. 8 shows a perspective view of the operation unit of FIG. 4 illustrating a position of a connector and a protection cover for a portable recording medium.

In FIG. 8, the protection cover 12 is in an opened condition, and the portable recording medium 33 is attached to the memory medium reader 35.

The protection cover 12 can be pivotable at a given supporting point. For example, the protection cover 12 can be pivotable at an axis O-O provided over the connector 34. Such pivotable configuration at the axis O-O may be preferable for efficiently using a space around the protection cover 12 compared to a slidably opening a cover because such pivotable configuration may not need a space for moving a cover in a straight direction. In addition, such pivotable configuration may also be preferable for opening and closing the protection cover 12 in a quick manner.

The protection cover 12 includes a substantially transparent portion so that the portable recording medium 33, attached to the memory medium reader 35, can be seen even when the protection cover 12 is closed. For example, the protection cover 12 may be made of a transparent material as a whole, by which a user can see the portable recording medium 33 attached to the memory medium reader 35.

As shown in FIG. 1, the image processing apparatus 1 has a panel cover 42 on a front side of the image processing apparatus 1. Such panel cover 42 may also include a substantially transparent portion so that a user can see a sheet medium ejected to the sheet ejection tray 6.

When a data writing operation or data reading operation is conducted for the portable recording medium 33, a locking unit prevents an opening operation of the protection cover 12. Such locking unit may be used to prevent an accidental removable of the portable recording medium 33 when a data writing operation or data reading operation is conducted for the portable recording medium 33, by which data damage or OS (operating system) trouble may be prevented.

Further, the protection cover 12 can be set to a closed condition with its self-weight, and can be opened by lifting the protection cover 12 with a hand. In this case, the protection cover 12 is set in a closed condition except when to open the protection cover 12.

Alternatively, the protection cover 12 is set to an opened condition except when to close the protection cover 12. For example, a coil spring may be attached to the axis O-O to constantly bias an opening force to the protection cover 12. Such configuration may be termed as "automatic cover-opening configuration" because the protection cover 12 can be maintained at an opened condition once the protection cover 12 is released from the closed condition.

In case of automatic cover-opening configuration, when the locking unit releases a locking condition of the protection cover 12, the protection cover 12 can be automatically opened and stopped at a given position by a stopper, by which a user can remove the portable recording medium 33 from the memory medium reader 33. In such a case, a user may not need to lift the protection cover 12 by hand.

If the locking unit is configured to release a locking condition of the protection cover 12 under a power-on condition of the image processing apparatus 1, the protection cover 12 cannot be opened when the image processing apparatus 1 is in a power-off condition. A user may feel inconvenience if the portable recording medium 33 cannot be removed from the image processing apparatus 1 under such power-off condition of the image processing apparatus 1. In view of such inconvenience, the locking unit may be configured to release a locking condition of the protection cover 12 under a power-off condition of the image processing apparatus 1.

When the image processing apparatus 1 is in a power-off condition, a data reading/writing operation for the portable recording medium 33 is not conducted. Accordingly, the locking unit can release a locking condition of the protection cover 12, and the portable recording medium 33 can be removed from the image processing apparatus 1 without causing problem such as data damage. Such locking release mechanism will be described later.

Figure 9:
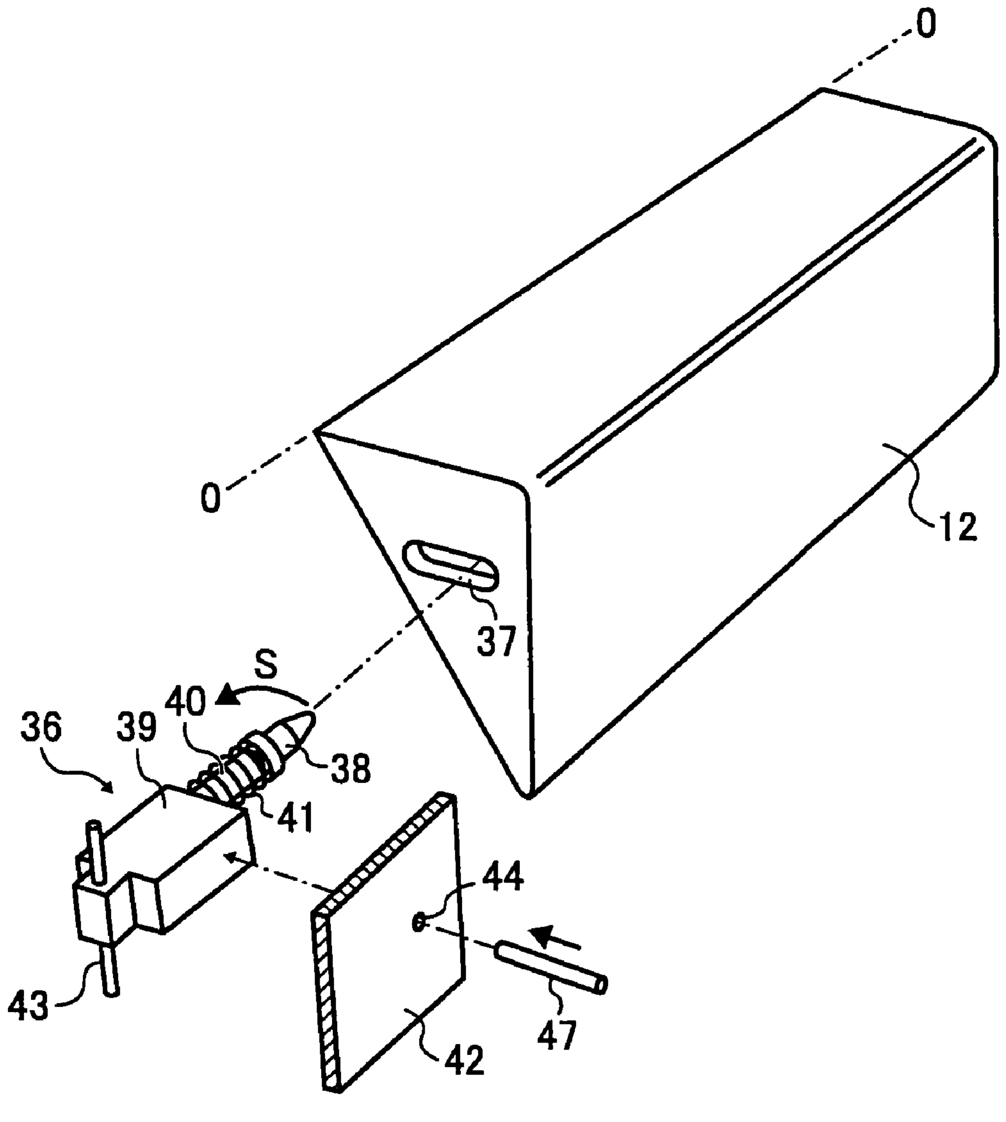
FIG. 9 shows an exploded view of a locking unit, having a latch member, for the protection cover shown in FIG. 8.

A description is now given of a locking unit provided for the protection cover 12 according to an example embodiment with reference to FIGS. 9 and 10.

As shown in FIG. 9, a locking unit 36 includes a latch member 38, which is engageable to a hole 37 provided on a side face of the protection cover 12. Although not shown, the hole 37 can be substituted with a concave portion, which can be engageable with the latch member 38, for example.

Figure 10A:
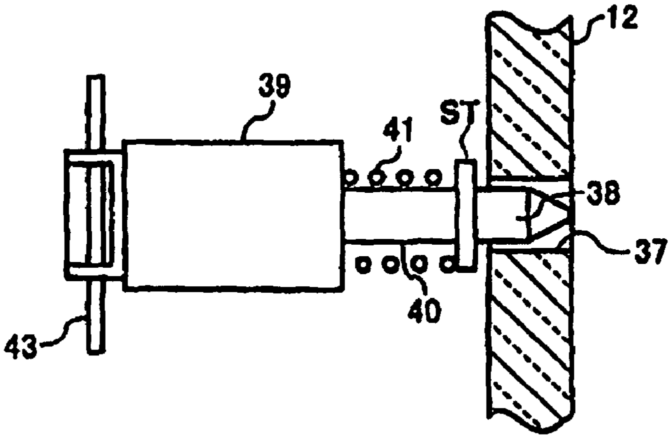
FIG. 10A shows a schematic cross-sectional view of the latch member and the protection cover shown in FIG. 9, which is in locking condition with an engagement of the latch member to the protection cover.

As shown in FIG. 10A, when the latch member 38 is engaged in the hole 37, the protection cover 12 cannot be opened. Accordingly, by engaging the latch member 38 in the hole 37 during a data writing or reading operation to the portable recording medium 33, a user cannot remove the portable recording medium 33 from the connector 34 by accident or mistake.

Further, the latch member 38 can be released from the hole 37 after completing data writing or reading operation to the portable recording medium 33, by which the portable recording medium 33 can be removed from the connector 34.

The latch member 38 can be engaged or disengaged the hole 37 by moving the latch member 38 in a reciprocating manner. For example, an electromagnetic device may be used to conduct such reciprocating movement of the latch member 38 to lock or unlock the protection cover 12.

Specifically, the electromagnetic device may be a solenoid 39 as shown FIG. 9, for example. The solenoid 39 has a movable shaft 40, which is integrated with the latch member 38. Such movable shaft 40 moves in a reciprocating manner by changing power-on or power-off condition of the solenoid 39. With such solenoid 39, a locking condition or unlocking condition of the protection cover 12 can be switched easily.

The movable shaft 40 integrally formed with the latch member 38 can be protruded from the solenoid 39 by an elastic force of a spring 41 when the solenoid 39 is set to a power-off condition as shown in FIG. 10A.

Figure 10B:
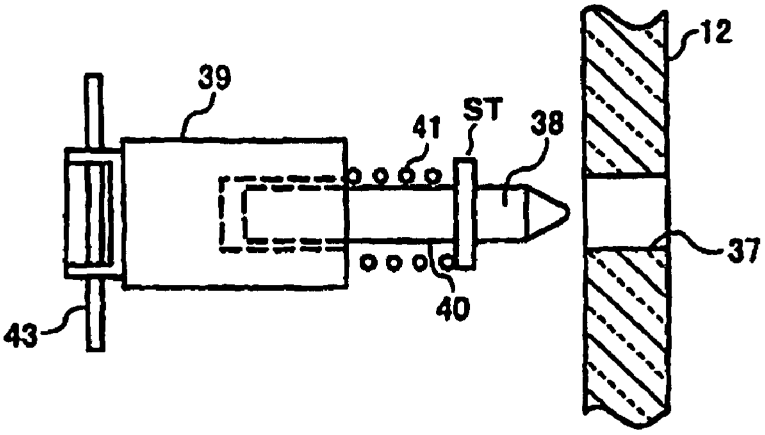
FIG. 10B shows a schematic cross-sectional view of the latch member and the protection cover shown in FIG. 9, which is in un-locking condition with a disengagement of the latch member from the protection cover.

Further, the movable shaft 40 can be retracted in the solenoid 39 by an electromagnetic force set greater than an elastic force of the spring 41 when the solenoid 39 is set to a power-on condition as shown in FIG. 10B.

As such, when the solenoid 39 is set to a power-off condition, the movable shaft 40 protrudes from the solenoid 39 with an elastic force of the spring 41, by which the latch member 38 engages with the hole 37, in which the movable shaft 40 is stopped at a given position with a stopper ST (FIGS. 10A-10B) provided for the solenoid 39.

Under such engagement condition of the latch member 38 and the hole 37, the solenoid 39 is then switched to a power-on condition. When the solenoid 39 is set to a power-on condition, the movable shaft 40 retracts in the solenoid 39 with an electromagnetic force set greater than an elastic force of the spring 41, by which the latch member 38 disengages from the hole 37.

As above described, when the solenoid 39 is in a power-off condition, the latch member 38 engages with the hole 37 to prevent an opening of the protection cover 12 as shown FIG. 10A, and when the solenoid 39 is in a power-on condition, the latch member 38 disengages from the hole 37 as shown FIG. 10B, by which the protection cover 12 can be set to a openable condition.

When the protection cover 12 is in an openable condition, the protection cover 12 can be opened by lifting the protection cover 12 with hand, or the protection cover 12 can be opened automatically if the above-mentioned automatic cover-opening configuration is provided.

The above-described solenoid 39 may be supported by an internal configuration (not shown) of the image processing apparatus 1. The solenoid 39 is set in a power-on or power-off condition with an instruction input via the operation key 7 or a touch key on the display panel 11, for example.

A description is now given of a locking release mechanism, which is used for opening the protection cover 12 in case of emergency. In such a case, the protection cover 12 is in closed condition while the solenoid 39 is in a power-off condition.

As shown in FIG. 9, the solenoid 39 is disposed inside the panel cover 42 (refer to FIG. 1) having an aperture 44, which has a diameter smaller than a size of fingertip, for example. The size of aperture 44 may be set to a given size, as required.

The solenoid 39 having a fulcrum shaft 43 swings in a direction shown by an arrow S in FIG. 9, which is substantially perpendicular to a reciprocating movement direction of the latch member 38. The fulcrum shaft 43 extends in an upward/downward direction as shown in FIG. 9.

Figure 11:
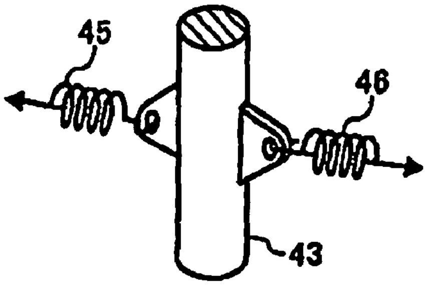
FIG. 11 shows a perspective view of a fulcrum shaft shown in FIG. 9, which is tensioned by springs in its diameter direction.

The fulcrum shaft 43 tensioned by springs 45 and 46 in its diameter direction as shown in FIG. 11 may be fixed to the image processing apparatus 1.

The solenoid 39 swings in a direction shown by an arrow S when an external force acts on the solenoid 39, and the solenoid 39 returns to the original position when such external force does not act on the solenoid 39. Specifically, the fulcrum shaft 43 returns to the original position when such external force does not act on the solenoid 39. Accordingly, the fulcrum shaft 43 tensioned by the springs 45 and 46 is used to return the solenoid 39 to the original position.

When the solenoid 39 is in the original position, the latch member 38 is engageable to the hole 37 formed on a side face of the protection cover 12, which is in a closed condition.

As shown in FIG. 9, the hole 37 may be a long-shaped hole, which is long in a swing direction of the latch member 38.

Under a condition that the latch member 38 engages the hole 37, a bar 47 is inserted through the aperture 44 in the panel cover 42. Such inserted bar 47 applies an external force on the solenoid 39 to swing the solenoid 39 at the fulcrum shaft 43.

If the solenoid 39 swings in a direction shown by an arrow S in FIG. 9, the latch member 38 disengages from the hole 37 because the latch member 38 also moves in a direction shown by an arrow S.

As such, in case of emergency, the bar 47 can be used to push the solenoid 39 to release a locking condition of the protection cover 12 set by the locking unit 36, by which the protection cover 12 can be opened.

After opening the protection cover 12, the bar 47 is withdrawn from the aperture 44, by which the solenoid 39 swings back at the fulcrum shaft 43 and returns to the original position.

As shown in FIGS. 9 and 10, the latch member 38 has a tip portion having an inclined face (or tapered face), for example.

When the protection cover 12 is opened, the protection cover 12 is positioned at an upper direction as shown in FIG. 8.

When the protection cover 12 is to be closed from such upper direction shown in FIG. 8, the tip portion of the latch member 38 having inclined face (or tapered face) runs on the protection cover 12 while pushing the spring 41. The tip portion of the latch member 38 continues to slide on the protection cover 12 until the protection cover 12 is completely closed. When the protection cover 12 is completely closed, the latch member 38 engages to the hole 37.

The above-mentioned emergency case includes several cases such as when the power failure occurs, and when the image processing apparatus stops its operation due to some reasons, for example.

Even in such emergency case, a user can push the solenoid 39 by inserting the bar 47 thorough the aperture 44. With such pushing operation, the solenoid 39 swings, by which the latch member 38 can disengage from the hole 37. Accordingly, the protection cover 12 can be opened. The panel cover 42 has a given thickness around the aperture 44 to effectively guide the bar 47 to the solenoid 39.

Figure 12:
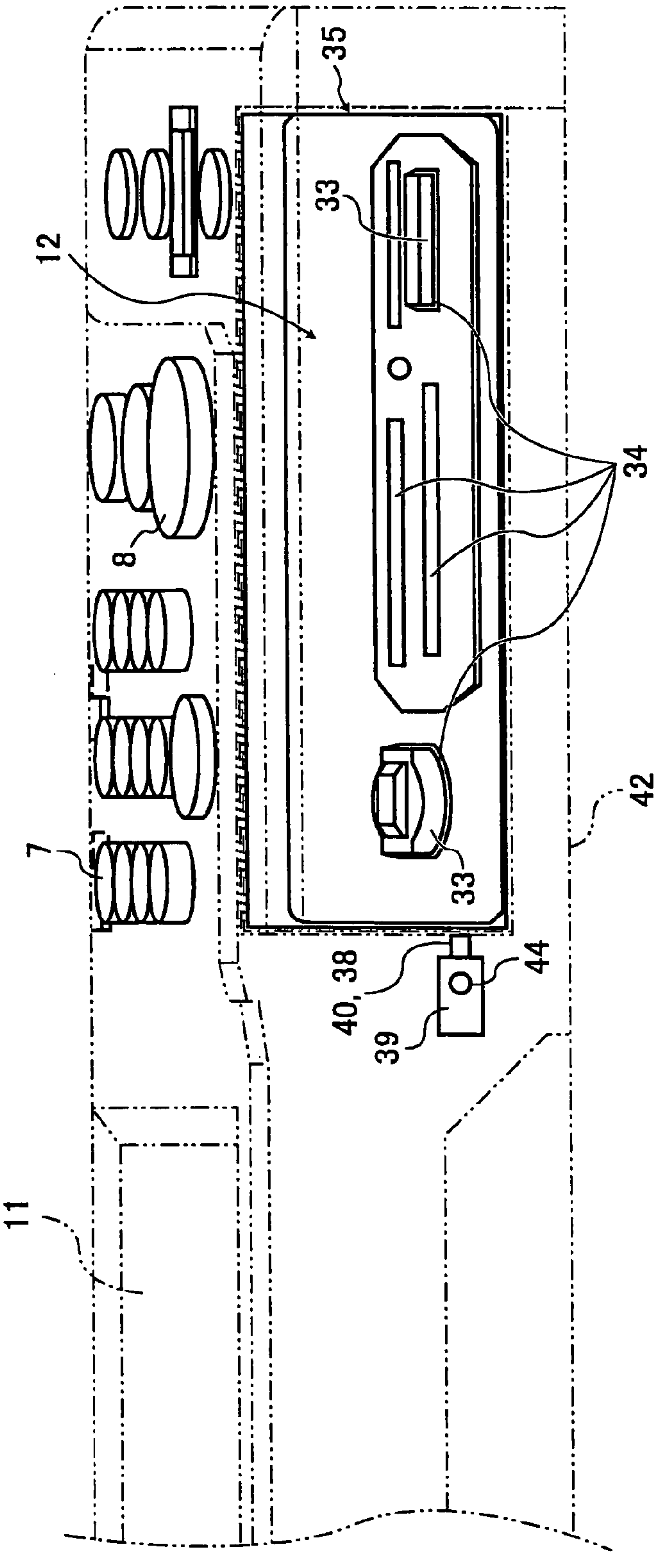
FIG. 12 shows a partial front view of the operation unit of FIG. 4.

In the above-explanation, the solenoid 39 is set to a power-on condition to retract the latch member 38 from the hole 37, and is set to a power-off condition to engage the latch member 38 to the hole 37. Instead of such controlling, the solenoid 39 can be set to a power-off condition to retract the latch member 38 from the hole 37, and is set to a power-on condition to engage the latch member 38 to the hole 37. FIG. 12 shows a front view of the protection cover 12, the solenoid 39, and the aperture 44 provided on the panel cover 42.

A description is now given of another locking unit according to another embodiment with reference to FIGS. 13 to 17.

Figure 13:
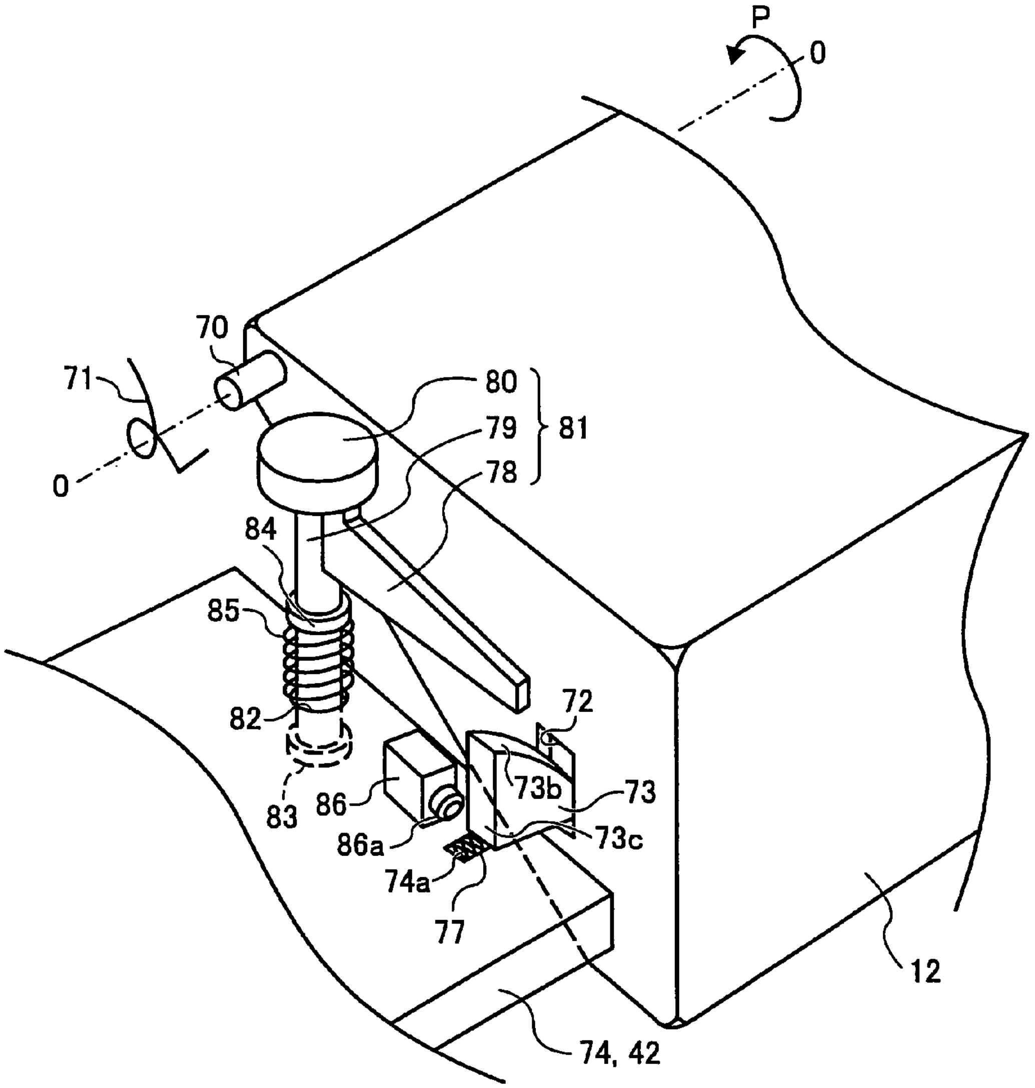
FIG. 13 shows a perspective view of another locking unit for a protection cover according to another example embodiment.

As shown in FIG. 13, the protection cover 12 pivots at the axis O-O of a shaft 70. In FIG. 13, the protection cover 12 is set to a closed position, and the protection cover 12 pivots in a counter-clockwise direction shown by an arrow P at the axis O-O when to open the protection cover 12.

The shaft 70 is provided with a coil spring 71, and one end of the coil spring 71 is attached to an end of the protection cover 12, and other end of the coil spring 71 is attached to a spring stopper (not shown). Such coil spring 71 applies a biasing force to the protection cover 12 so that the protection cover 12 is constantly biased toward the opening direction, for example.

As shown in FIG. 13, the protection cover 12 has a hole 72 having a rectangular-shape on one side face of the protection cover 12. Although not shown, such hole 72 can be substituted with a concave portion, for example.

As shown in FIG. 13, a latch member 73 can engage in the hole 72, wherein the latch member 73 is attached on a base plate 74 included inside the panel cover 42.

The base plate 74 has an upper face, which may be at a substantially identical height of the hole 72 of the protection cover 12 when the protection cover 12 is in a closed position.

Figure 14:
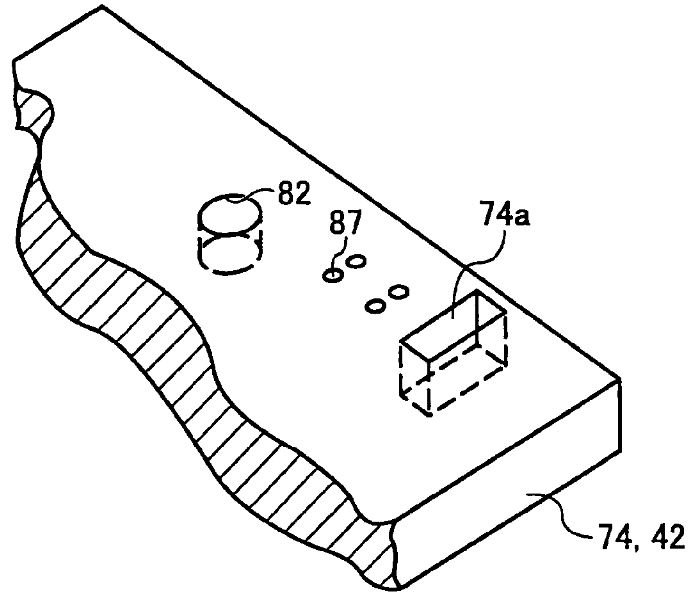
FIG. 14 shows a perspective view of a base plate for the locking unit of FIG. 13.
Figure 15:
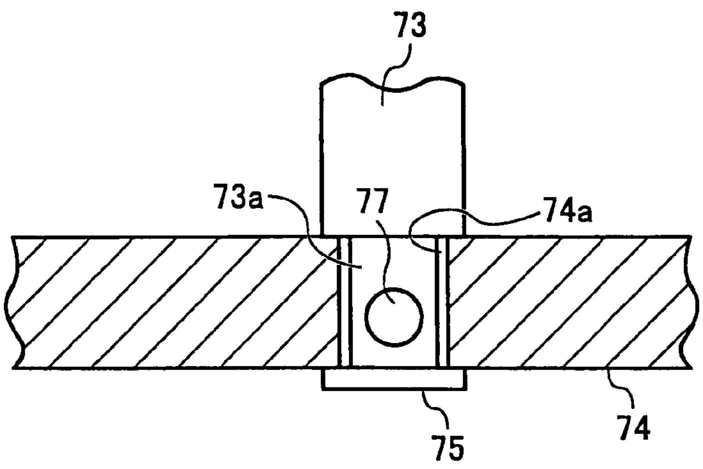
FIG. 15 shows a schematic cross-sectional view of the base plate of FIG. 14 having a guide groove.

The base plate 74 has a guide groove 74*a* as shown in FIG. 14 in a direction parallel to the axis O-O. The guide groove 74*a* may be a through-hole having a rectangular shape as shown in FIG. 15. Such guide groove 74*a* faces the hole 72 as shown in FIG. 13.

Figure 16:
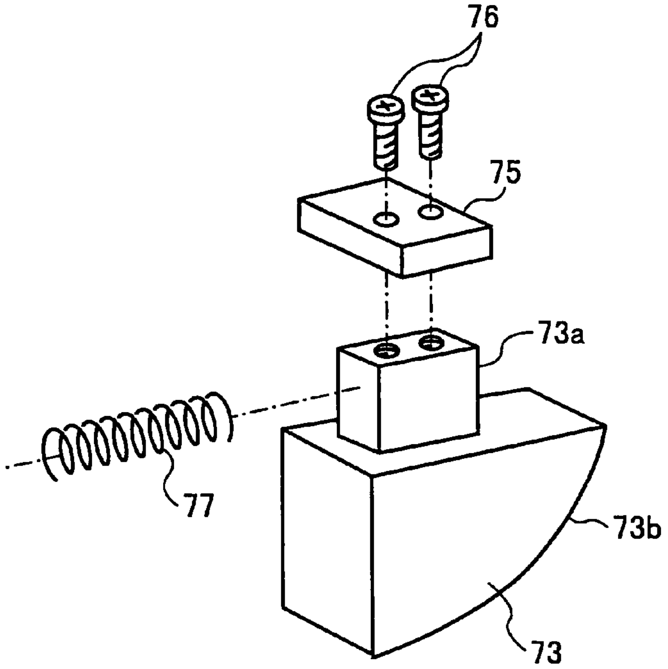
FIG. 16 shows an exploded perspective view of a latch member used in the locking unit of FIG. 13.

As shown in FIG. 16, the latch member 73 has a piece 73*a*, which can engage and slide in the guide groove 74*a*. As shown in FIG. 16, a retaining plate 75 is fixed on the piece 73*a* with a screw 76.

A length of the piece 73*a* in the axis O-O direction is set smaller than a length of the guide groove 74*a*. Accordingly, the piece 73*a* can slide in the guide groove 74*a* in a reciprocating manner. Therefore, the latch member 73 can move along the guide groove 74*a* in a reciprocating manner with a given stroke. Such given stroke is defined as a distance between a latch-member-engaged-position and a latch-member-disengaged-position. At the latch-member-engaged-position, the latch member 73 engages with the hole 72, and at the latch-member-disengaged-position, the latch member 73 disengages from the hole 72 completely.

As shown in FIG. 13, a spring 77 is disposed in the guide groove 74*a*. Such spring 77 is sandwiched by the piece 73*a* and one end of the guide groove 74*a*, by which the spring 77 constantly applies a biasing force to the latch member 73 to bias the latch member 73 toward the protection cover 12.

In FIG. 13, the latch member 73 biased by the spring 77 engages with the hole 72 to keep the protection cover 12 at a closed condition.

When the latch member 73 disengages from the hole 72, the protection cover 12 can be opened with a biasing force of the coil spring 71 attached to the shaft 70. Accordingly, the latch member 73 needs to be moved to the latch-member-disengaged-position when to open the protection cover 12. The latch member 73 can be moved to the latch-member-disengaged-position as follows.

As shown in FIGS. 13 and 16, the latch member 73 has a wedge-like shape. In other words, the latch member 73 has a curved-face 73*b*, which is tapered in the axis O-O direction as shown in FIGS. 13 and 16. As shown in FIG. 13, a height of the curved-face 73*b* of latch member 73 decreases as closer to the protection cover 12.

As shown in FIG. 13, a push unit 81 is disposed over the curved-face 73*b* of the latch member 73. The push unit 81 includes a push lever 78, a shaft 79, and a push button 80, which are formed integrally each other, for example.

Figure 17:
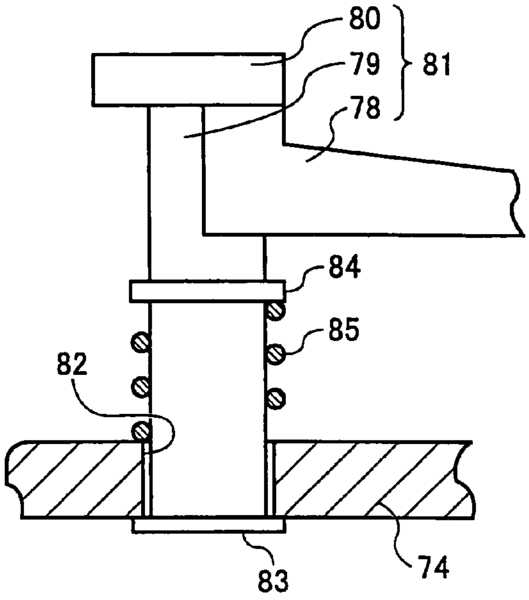
FIG. 17 shows a schematic cross-sectional view of a pushing unit used in the locking unit of FIG. 13.

The shaft 79, engaged with a through-hole 82 in the base plate 74 (refer to FIGS. 13, 14, and 17), slides in the through-hole 82. The shaft 79 has a retaining member 83 fixed on the bottom face of the shaft 79, by which the shaft 79 can be retained in the base plate 74 (refer to FIG. 17). The shaft 79 also has a spring stopper 84 (refer to FIGS. 13 and 17). As shown in FIGS. 13 and 17, a spring 85 is disposed between the spring stopper 84 and the base plate 74 along the shaft 79.

When no external force acts on the push button 80, the push lever 78 is positioned at an upward of the curved-face 73*b* with a biasing force of the spring 85 as shown in FIG. 13.

When to open the protection cover 12, the push button 80 is pressed downward so that the push lever 78 contacts the curved-face 73*b* of the latch member 73.

When the push lever 78 contacts the curved-face 73*b*, a component force in horizontal direction acting on the curved-face 73*b* moves the latch member 73 to the latch-member-disengaged-position. In such a case, such component force in horizontal direction is greater than an elastic force of the spring 77.

When the latch member 73 is moved to the latch-member-disengaged-position, the protection cover 12 can pivot and open in a direction shown by an arrow P (refer to FIG. 13) with an elastic force of the coil spring 71. Such protection cover 12 is opened to a given position regulated by a stopper (not shown).

On one hand, when the push button 80 is relieved from an external force, the push lever 78 returns to an original position, which is over the curved-face 73*b*, with an elastic force of the spring 85. At such original position, the retaining member 83 contacts the base plate 74 as shown in FIG. 17. When the protection cover 12 is in an opened position, the latch member 73 is positioned to a locking position of the latch member 73 with an elastic force of the spring 77.

Because the protection cover 12 is in an opened position and the latch member 73 at such locking position exists under a side face of the protection cover 12, the protection cover 12 can be set to a closed position as follows.

When the protection cover 12 is closed from the opened position, a side face of the protection cover 12 starts to contact the curved-face 73*b* of the latch member 73. In such closing process, a component force in horizontal-direction acting on the curved-face 73*b* is greater than an elastic force of the spring 77 to push the latch member 73 in a leftward direction in FIG. 13.

When the latch member 73 starts to engage to the hole 72, the latch member 73 is pushed toward the hole 72 with an elastic force of the spring 77, and then the latch member 73 engages in the hole 72 completely. Accordingly, the protection cover 12 is returned to a closed position.

As such, when the protection cover 12 is closed from an opened condition, the latch member 73 engages to the hole 72 automatically to set a closed condition of the protection cover 12. Such protection cover 12, set in a closed condition, can be opened by pushing the push unit 81 as above described.

If the push button 80 is repeatedly pushed and returned to the original position, the shaft 79 may rotate in the through-hole 82, by which the push lever 78 may not be positioned over the curved-face 73*b* correctly over time. In view of such drawback, the shaft 79 may have a key (not shown) and the through-hole 82 may have a groove (not shown) to be fitted with the key to prevent such rotation of the shaft 79 in the through-hole 82.

With the above-described configuration, the locking unit prevents an accidental opening of the protection cover 12 during a data writing or reading operation for the portable recording medium 33.

Furthermore, as shown in FIG. 13, a solenoid 86 is provided on the upper face of base plate 74. The solenoid 86 is fixed on the base plate 74 with four screw holes 87 shown in FIG. 14, and the solenoid 86 is provided proximity of the latch member 73 as shown in FIG. 13.

The solenoid 86 has a movable shaft 86*a* as shown in FIG. 13. The movable shaft 86*a* retracts in the solenoid 86 with an electromagnetic force when the solenoid 86 is set to a power-on condition, and the movable shaft 86*a* protrudes from the solenoid 86 with a force of spring (not shown) provided for the movable shaft 86*a* when the solenoid 86 is set to a power-off condition.

Under a closed condition of the protection cover 12, the movable shaft 86*a* protrudes to a protruded position (not shown) by setting the solenoid 86 in a power-off condition. In such protruded condition, the movable shaft 86*a* contacts a contact face 73*c* of the latch member 73, by which the movable shaft 86*a* can lock the latch member 73.

Although not shown, the latch member 73 may be provided with a receiving portion to be engaged with the movable shaft 86*a* for locking the latch member 73. Such receiving portion may be a hole or a concave portion, for example.

Accordingly, when the solenoid 86 is set to a power-off condition, the latch member 73 is mechanically locked. Therefore, even if the push button 80 is pushed, a locking of the latch member 73 is not released. Such locking condition of the latch member 73 can be released by setting the solenoid 86 to a power-on condition. As such, an accidental opening of the protection cover 12 during data writing/reading operation for the portable recording-medium 33 can be prevented by controlling power-on or power-off condition for the solenoid 86.

In such configuration, the spring 77 biases the latch member 73 toward the hole 72 to engage the latch member 73 to the hole 72. The piece 73*a* and guide groove 74*a* may be used as stopper to stop the latch member 73 when the latch member 73 engages in the hole 72. The piece 73*a* and the guide groove 74*a* are also used as a guiding member to guide the latch member 73 to an engaged position with the hole 72, and to guide the latch member 73 to a disengaged position with respect to the hole 72. The solenoid 86 is used as an electromagnetic device for moving the movable shaft 86*a* in a reciprocating manner to lock or unlock the contact face 73*c* of the latch member 73. Although not shown, the contact face 73*c* may have a receiving portion to engage with the movable shaft 86*a* of the solenoid 86. Such receiving portion may be a hole or a concave portion, for example. The push unit 81 is used to disengage the latch member 73 from the hole 72.

A description is now given of another locking unit with reference to FIGS. 18 to 22.

Figure 18:
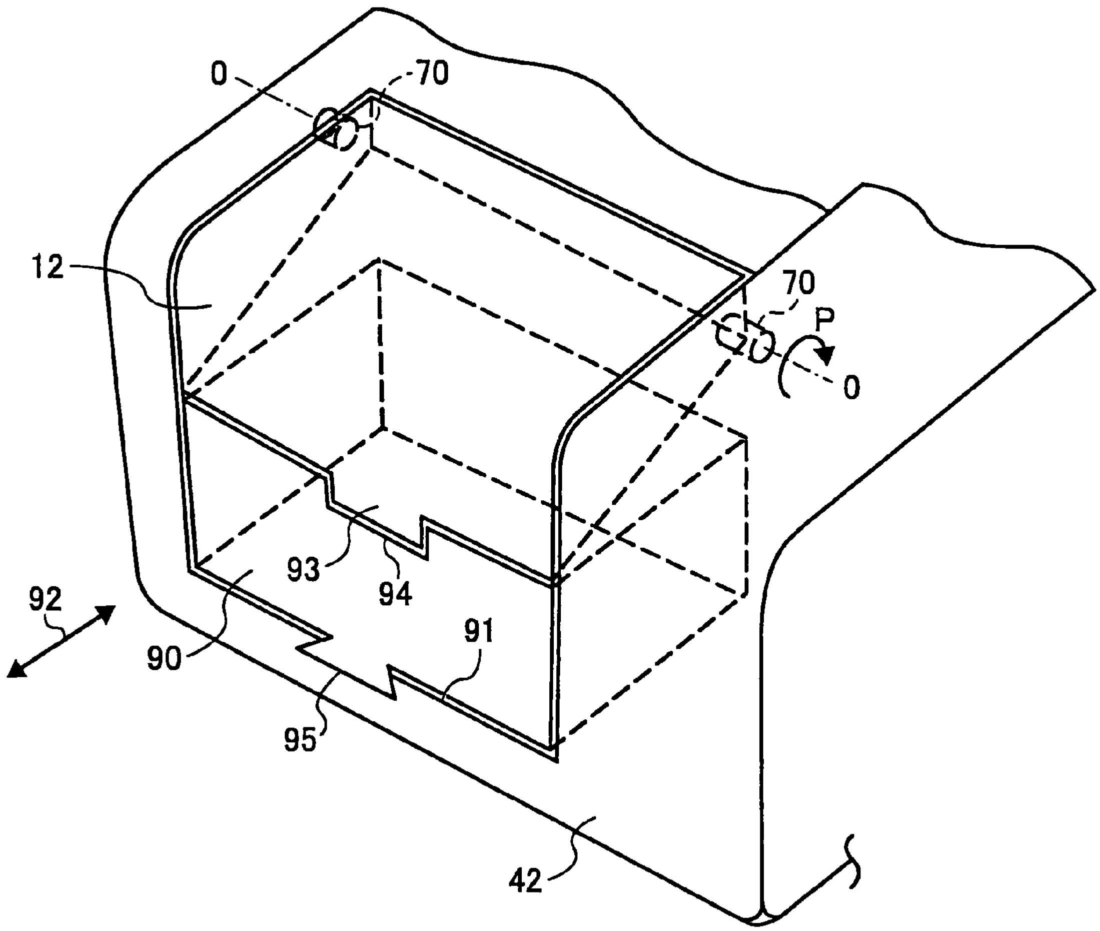
FIG. 18 shows a perspective view of another locking unit for a protection cover according to another example embodiment.

The protection cover 12 pivots at the axis O-O of the shaft 70. In FIG. 18, the protection cover is in a closed position. The protection cover 12 can pivot in a direction shown by an arrow P at the axis O-O when to open the protection cover 12. The shaft 70 may be provided with a coil spring (not shown). Such coil spring may apply a biasing force to the protection cover 12 so that the protection cover 12 is constantly biased toward the opening direction. As above described, the protection cover 12 covers or protects the portable recording medium 33 attached to the memory medium reader 35.

As shown in FIG. 18, a reciprocally-movable unit 90 may be provided under the protection cover 12. The reciprocally-movable unit 90 may be made of a transparent material having a box shape, for example.

The reciprocally-movable unit 90 engages with a guide groove 91 formed on the panel cover 42, and can be moved in a direction shown by an arrow 92 in FIG. 18.

The reciprocally-movable unit 90 has a convexed portion formed on its bottom face. Because such convexed portion engages a groove 95 formed on the panel cover 42, the reciprocally-movable unit 90 can move in a direction shown by an arrow 92 in a reciprocating manner without detaching from the guide groove 91.

The protection cover 12 has a hook 93, and the reciprocally-movable unit 90 has an engagement portion 94. Such protection cover 12 and the reciprocally-movable unit 90 engage with each other by engaging the hook 93 and the engagement portion 94.

Figure 19:
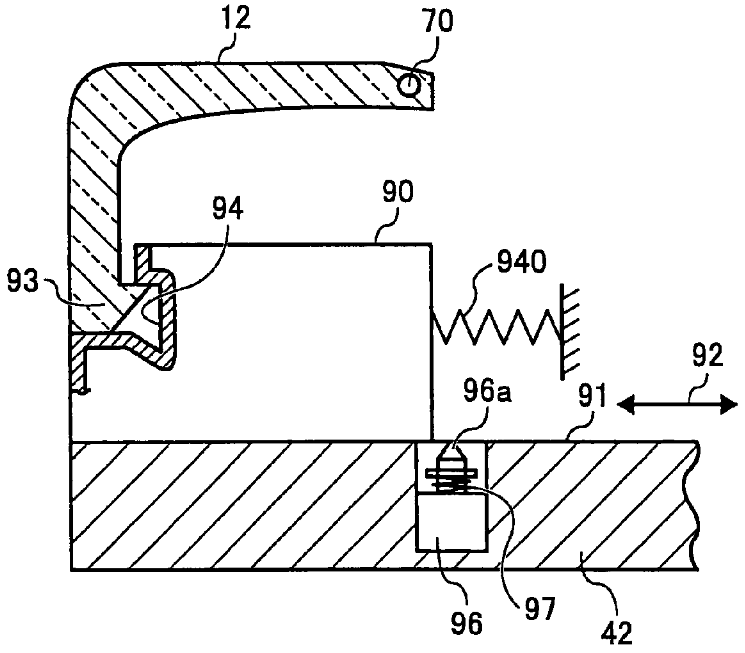
FIG. 19 shows a schematic cross-sectional view of the protection cover shown in FIG. 18, which is in a closed position.
Figure 20:
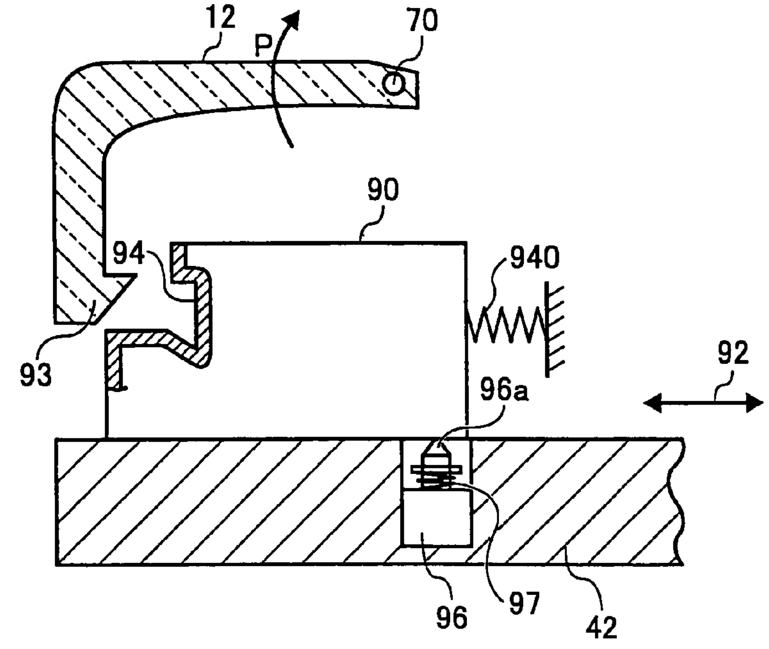
FIG. 20 shows a schematic cross-sectional view of the protection cover shown in FIG. 18, in which a reciprocally-movable unit is pushed and a hook is disengaged from an engagement portion.
Figure 21:
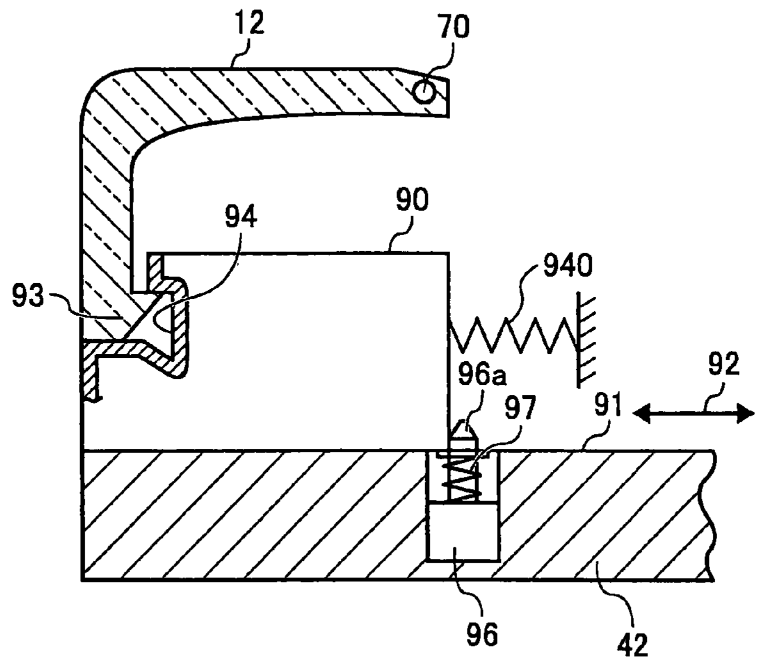
FIG. 21 shows a schematic cross-sectional view of the protection cover shown in FIG. 18, in which a solenoid is used to block a movement of a reciprocally-movable unit.

FIGS. 19 to 21 show cross-sectional views of the protection cover 12 and the reciprocally-movable unit 90, cut at the hook 93 and the engagement portion 94. FIG. 19 shows a cross-sectional view of the protection cover 12, which is in a closed position, which corresponds to FIG. 18. As shown in FIGS. 19 to 21, the protection cover 12 is biased toward a leftward direction with a spring 940.

As shown in FIG. 19, the hook 93 of the protection cover 12 engages with the engagement portion 94 of the reciprocally-movable unit 90.

In FIG. 19, the protection cover 12 is in a closed condition because the engagement portion 94 engages with the hook 93 with an elastic force of the spring 940, which is used to bias the reciprocally-movable unit 90 toward a leftward direction in FIG. 19.

If the reciprocally-movable unit 90 is pushed into a rightward direction in FIG. 19, the hook 93 is disengaged from the engagement portion 94 as shown in FIG. 20, by which the protection cover 12 pivots and opens in a direction shown by an arrow P with an effect of a force of spring (not shown) attached to the shaft 70.

The protection cover 12 can be set to a closed position (refer to FIG. 19) from an opened position (refer to FIG. 20) by pivoting the protection cover 12 in a direction opposite to the arrow P until the hook 93 engages with the engagement portion 94.

As such, when the protection cover 12 is in a closed condition, the protection cover 12 can be opened by disengaging the hook 93 from the engagement portion 94 by pushing the reciprocally-movable unit 90, and when the protection cover 12 is in an opened condition, the protection cover 12 can be closed by engaging the hook 93 to the engagement portion 94 by closing the protection cover 12.

With such configuration, the locking unit can prevent an accidental opening of the protection cover 12 during a data writing or reading operation for the portable recording medium 33.

As shown in FIGS. 19 to 21, a solenoid 96 is provided in the panel cover 42. Specifically, the solenoid 96 is provided under a sliding face of the reciprocally-movable unit 90 as shown in FIGS. 19 to 22.

When the solenoid 96 is set to a power-on condition, a movable shaft 96*a* retracts in the solenoid 96 so that the reciprocally-movable unit 90 can freely move in a direction shown by an arrow 92 shown in FIGS. 19 and 20.

When the solenoid 96 is set to a power-off condition and the protection cover 12 is in a closed condition, the movable shaft 96*a* protrudes as shown in FIG. 21 with an effect of a spring 97, and such protruded movable shaft 96*a* blocks a movement of the reciprocally-movable unit 90, in which the engagement portion 94 of the reciprocally-movable unit 90 engages with the hook 93 of protection cover 12.

Accordingly, even if a user tries to open the protection cover 12 by accident or mistake, the reciprocally-movable unit 90 cannot be moved, by which an accidental opening of the protection cover 12 can be prevented.

The protection cover 12 can be opened by setting the solenoid 96 to a power-on condition because the reciprocally-movable unit 90 can be moved as above-described with a retraction of the movable shaft 96*a*.

Figure 22:
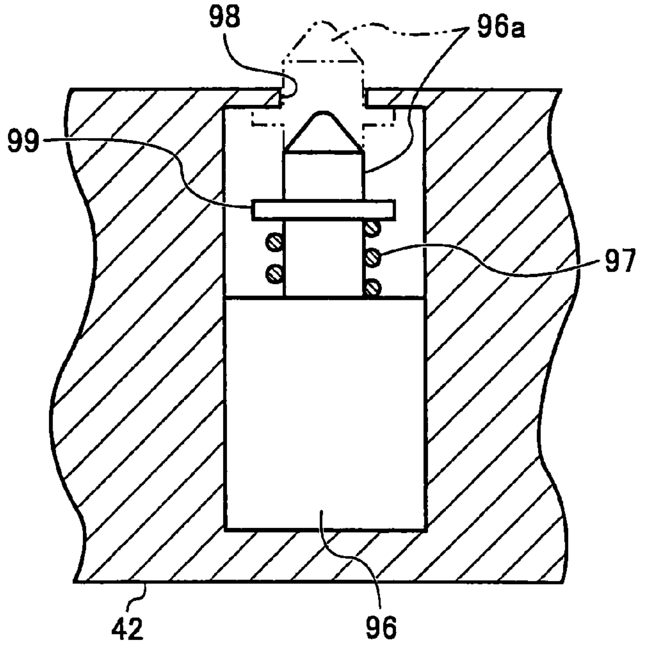
FIG. 22 shows a schematic cross-sectional view of the solenoid shown in FIG. 19 provided in a panel cover.

FIG. 22 is an enlarged view of the solenoid 96. The panel cover 42 has an opening 98 for protruding the movable shaft 96*a* in an upward direction, and a spring stopper 99 of the movable shaft 96*a* contacts a seat of the opening 98 to stop the movable shaft 96*a* at a given position.

As such, an accidental opening of the protection cover 12 during a data writing or reading operation for the portable recording medium 33 can be prevented by controlling power-on/off condition to the solenoid 96.

As such, the reciprocally-movable unit 90 can engages with the hook 93 of protection cover 12. The spring 940 biases the reciprocally-movable unit 90 to engage the reciprocally-movable unit 90 to the protection cover 12. The groove 95 is used to guide the reciprocally-movable unit 90 to a latch-member-engaged-position (e.g., engagement of the reciprocally-movable unit 90 and the protection cover 12), and is used to guide the reciprocally-movable unit 90 to a latch-member-disengaged-position. The solenoid 96, used as electromagnetic device, has the movable shaft 96*a*, which can move in a reciprocating manner to lock or unlock the reciprocally-movable unit 90.

With such configuration shown in FIGS. 18 to 22, an accidental opening of the protection cover 12 can be prevented. Such configuration can preferably prevent an accidental opening of the protection cover 12 even if the protection cover 12 may have the above-mentioned automatic cover-opening configuration.

A description is now given of another locking unit with reference to FIGS. 23 to 27.

Figure 23:
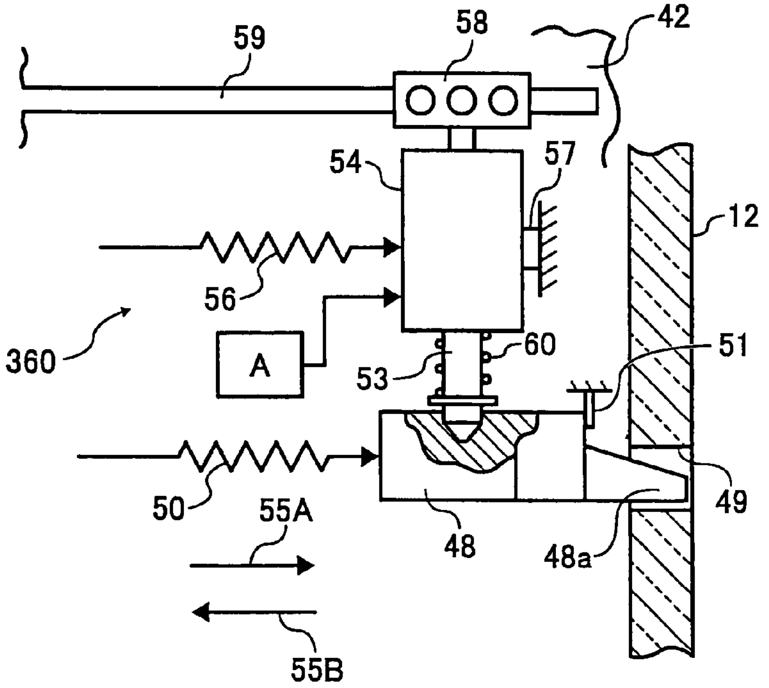
FIGS. 23 and 24 are schematic views of another locking unit and a protection cover according to another example embodiment for illustrating an operation process of another locking unit.

A locking unit 360 shown in FIG. 23 includes a latch member 48 and a solenoid 54 as separate devices, which is different from the above-described locking unit integrating a latch member and a solenoid.

For example, the latch member 48, shaped in a block shape, has an edge portion 48*a* having wedge-like shape, which can engage a hole 49 of the protection cover 12. Such hole 49 may be substituted with a concave portion, for example.

The latch member 48 is biased by a spring 50 to engage the latch member 48 to the hole 49 of the protection cover 12 when the protection cover 12 is in a closed condition. Such spring 50 is used as first biasing member.

As shown in FIG. 23, a latch member stopper 51 is provided in the image processing apparatus 1. The latch member stopper 51 is used to stop the movement of the latch member 48, biased by the spring 50, at an engaging position of the latch member 48 to the hole 49.

Although not shown, a latch member guiding unit is provided in the image processing apparatus 1 to guide the latch member 48 to the hole 49. Specifically, the latch member guiding unit may guide the latch member 48 in an engaging direction 55A or a disengaging direction 55B. Such latch member guiding unit may have a groove extending in the engaging direction 55A or the disengaging direction 55B. Such groove may engage with a convex portion (not shown) formed on the latch member 48.

Figure 24:
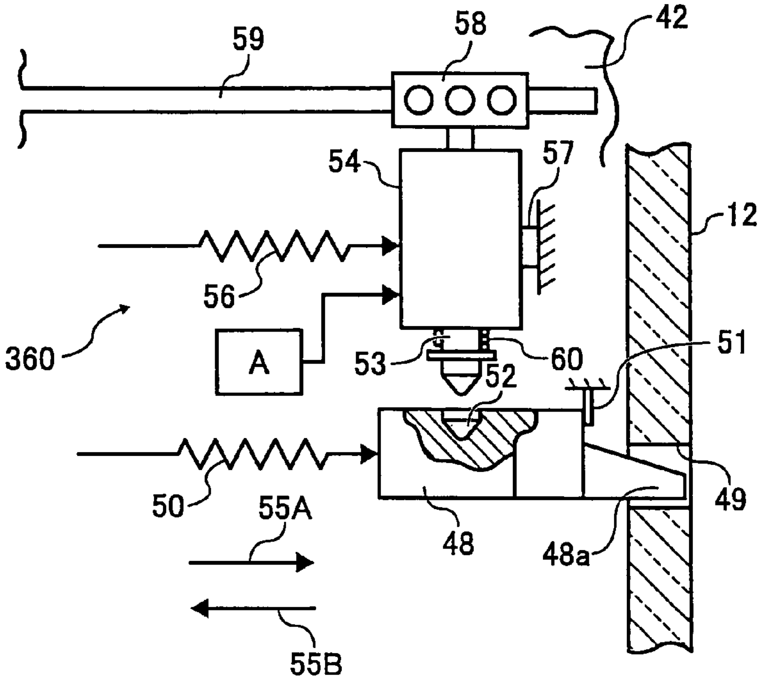

Further, the latch member 48 has an upper face having an engagement hole 52 as shown in FIG. 24.

As shown in FIG. 24, the solenoid 54 is disposed over the latch member 48. The solenoid 54 may have a movable shaft 53, which can move in an upward/downward direction in a reciprocating manner. Such movable shaft 53 can be inserted to the engagement hole 52 as shown in FIG. 24, wherein the movable shaft 53 is biased to the downward direction with a spring 60. As such, the solenoid 54 is used to engage or disengage the movable shaft 53 to the engagement hole 52 with electromagnetic force.

Although not shown, an electromagnetic device guide unit is provided in the image processing apparatus 1 to move the solenoid 54 in the engaging direction 55A or the disengaging direction 55B. Such electromagnetic device guide unit (not shown) may include a groove extending in the engaging direction 55A or the disengaging direction 55B. Such groove may engage with a convex portion (not shown) formed on the solenoid 54.

As shown in FIG. 23, a spring 56, used as a second biasing member, is provided to bias the solenoid 54 in a same biasing direction of the spring 50 (used as the first biasing member), which biases the latch member 48.

Further, as shown in FIG. 23, an electromagnetic device stopper 57 is provided in the image processing apparatus 1. The electromagnetic device stopper 57 is used to stop a movement of the solenoid 54 by the spring 56 at a given position so that the movable shaft 53 faces the engagement hole 52 of the latch member 48, stopped by the latch member stopper 51.

Further, as shown in FIG. 23, a knob 58 and a groove 59 are provided in the image processing apparatus 1, wherein the knob 58 is connected to the solenoid 54. Such knob 58 is slidably engaged on the groove 59, and used to move the solenoid 54 in the engaging direction 55A or disengaging direction 55B. Such knob 58 may also be a slider or a pushing member, for example, and such knob 58 may be termed as manipulation member, which is used by a user to move the above-described members such as latch member 48.

In FIG. 23, the protection cover 12 is in a closed condition. If the solenoid 54 is set to a power-off condition and the movable shaft 53 engages with the engagement hole 52, a user can move the knob 58 along the groove 59 in the disengaging direction 55B for opening the protection cover 12.

If the knob 58 is moved in the disengaging direction 55B, the solenoid 54 and the latch member 48, engaged to the movable shaft 53 of the solenoid 54, can be also moved in the disengaging direction 55B.

With such movement, the latch member 48 is disengaged from the hole 49 of the protection cover 12, by which the protection cover 12 can be set in an openable condition.

On one hand, as shown in FIG. 24, when a data reading/writing operation is conducted for the portable recording medium 33, the solenoid 54 is set to a power-on condition, by which the solenoid 54 can retract the movable shaft 53 because such retraction force can be set greater than an elastic force of the spring 60. If the movable shaft 53 retracts from the engagement hole 52, the movable shaft 53 is disengaged from the latch member 48.

In a condition shown in FIG. 24, the movable shaft 53 is disengaged from the latch member 48, and the knob 58 and the solenoid 54 can be moved in the disengaging direction 55B by a force (e.g., hand) greater than a spring force of the spring 56.

However, because the movable shaft 53 is disengaged from the latch member 48 and the latch member 48 is in an engaged condition with the hole 49 of the protection cover 12 by a spring force of the spring 50, the protection cover 12 cannot be opened even if the knob 58 and the solenoid 54 is moved in the disengaging direction 55B.

Accordingly, the knob 58 may move without effecting to the latch member 48, which locks the protection cover 12.

Therefore, even if a user tries to move the knob 58 by accident or mistake to open the protection cover 12 during a data reading/writing operation for the portable recording medium 33, the protection cover 12 cannot be opened, by which data damage or OS (operating system) trouble can be prevented.

In a configuration shown in FIGS. 23 and 24, the knob 58 is exposed to an external side of the panel cover 42, but other devices are disposed in the panel cover 42.

Such configuration that the knob 58 moves without effecting to the latch member 48 may be useful to inform a user that an opening of protection cover (or removal of recording medium) is not allowed because such opening of protection cover may cause data processing error. With such ineffective movement of the knob 58, a user may not exercise a too-great force for opening the protection cover, which may cause damages to the locking unit.

As shown in FIGS. 23 and 24, a controlling unit A may control a power-off/power-on condition of the solenoid 54 by transmitting a signal to the solenoid 54. Such signal from the controlling unit A may be used to select a power-off/power-on condition of the solenoid 54.

As above-described, when the protection cover 12 is closed and the solenoid 54 is in a power-on condition, the knob 58 can be moved without effecting to the latch member 48, which locks the protection cover 12. Accordingly, the edge portion 48*a* of latch member 48 cannot be disengaged from the hole 49.

Hereinafter, a locking release mechanism in case of emergency, which needs to open the protection cover 12 and to remove recording medium, is described. Such emergency case may be a time of power failure, for example.

Figure 25:
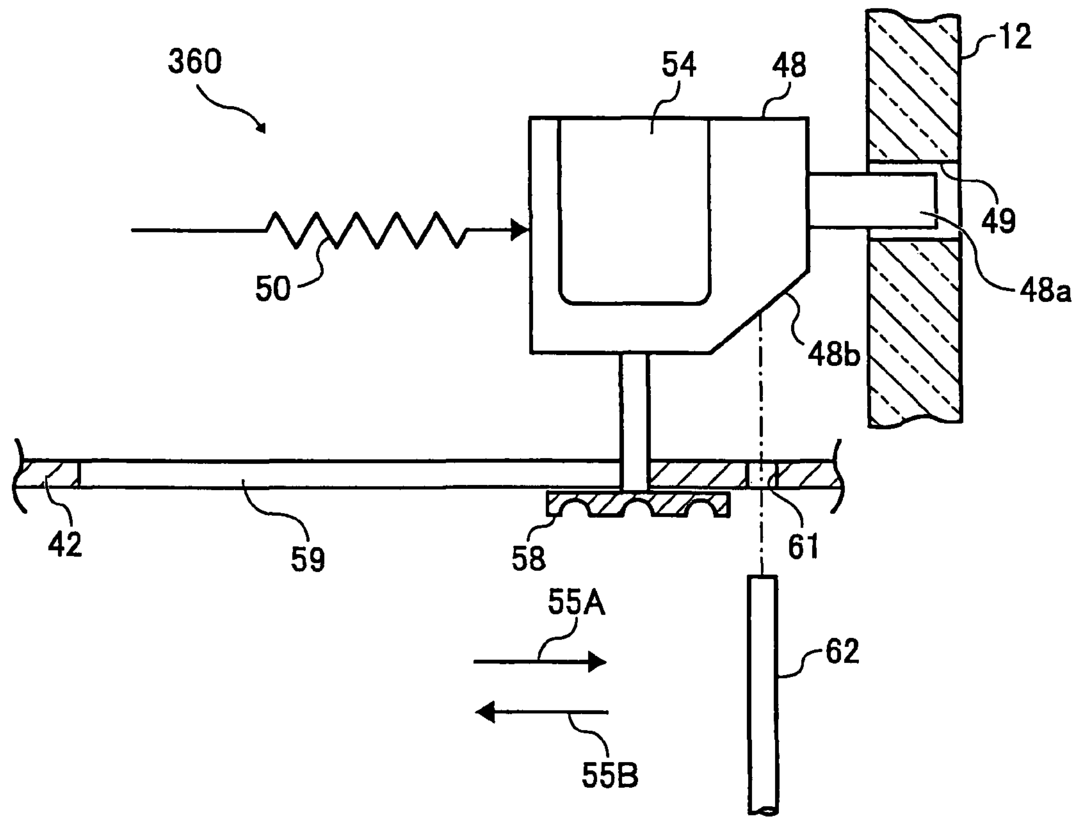
FIG. 25 shows another schematic view of the locking unit of FIG. 23 for illustrating an operation process of the locking unit by using a bar.
Figure 26:
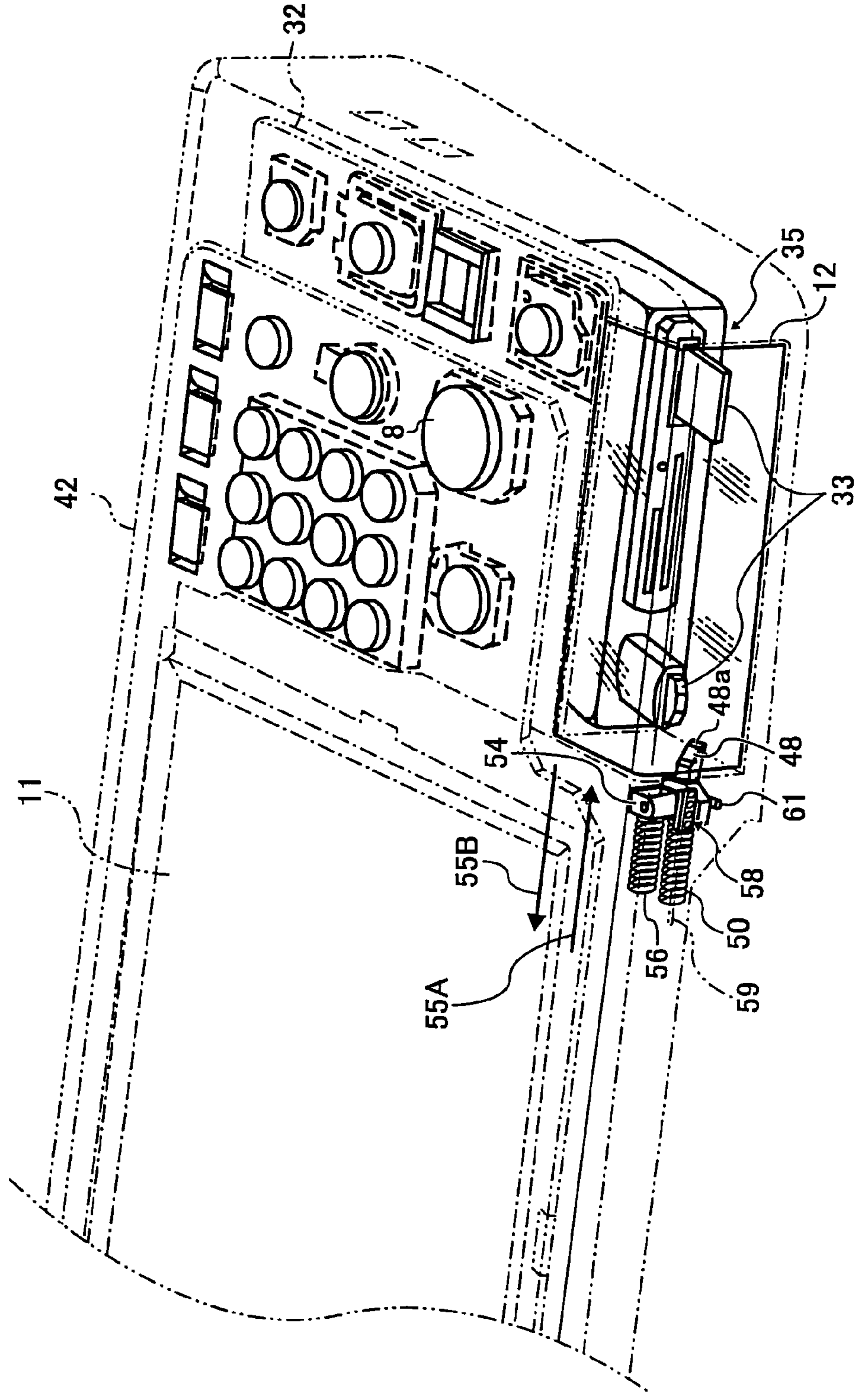
FIG. 26 shows a perspective view of an operation unit having the locking unit of FIG. 23.
Figure 27:
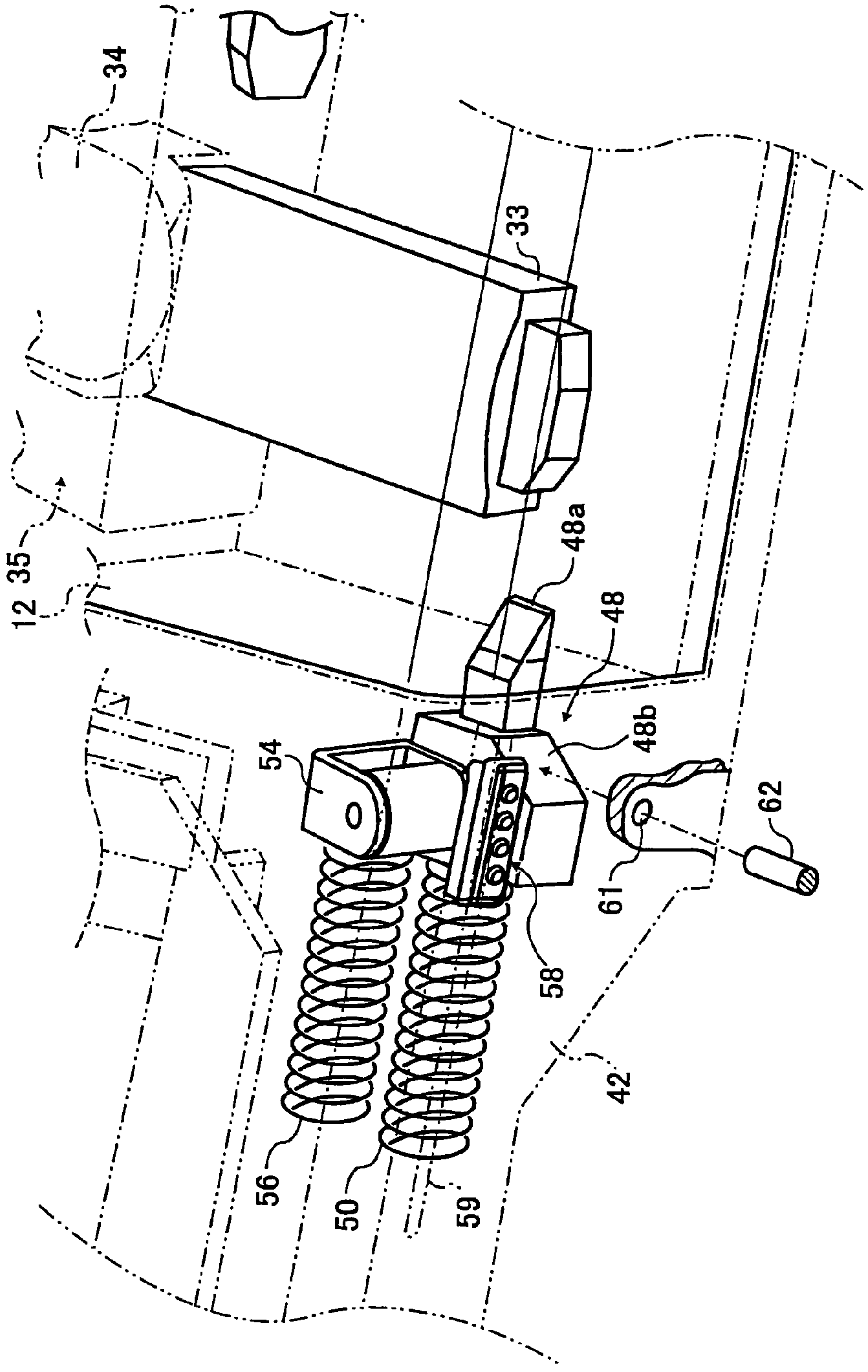
FIG. 27 shows an enlarged perspective view of the operation unit of FIG. 26.

FIG. 25 shows a plan view of the locking unit 360 shown in FIG. 23. As shown in FIG. 25, the panel cover 42 includes an aperture 61 having a diameter smaller than a size of fingertip. The size of aperture 61 can be set to a given size, as required.

As shown in FIG. 25, the latch member 48 and the solenoid 54 are disposed in the panel cover 42, and the knob 58 is disposed outside of the panel cover 42.

As shown in FIG. 25, a bar 62 can be inserted through the aperture 61 to push the latch member 48. The bar 62 can be made of clip or the like. With such pushing process, the latch member 48 is disengaged from the hole 49 as follows.

As shown in FIG. 25, the latch member 48 has an inclined-face 48*b*, which can be pushed by the bar 62. When the bar 62 pushes the inclined-face 48*b* of the latch member 48, the latch member 48 can be moved in the disengaging direction 55B.

In case of emergency (e.g., an image processing apparatus stops operation, power failure), the bar 62 may be inserted through the aperture 61 to push the inclined-face 48*b*, by which the latch member 48 can be moved in the disengaging direction 55B because such pushing force is greater than a spring force of the springs 50.

With such movement of the latch member 48, the edge portion 48*a* of the latch member 48 is disengaged from the hole 49 of the protection cover 12, by which the protection cover 12 can be set to an openable condition. The panel cover 42 may have a given thickness around the aperture 61 to effectively guide the bar 62 to the latch member 48.

As such, the protection cover 12 covers or protects the portable recording medium 33, and the edge portion 48*a* of latch member 48 is engaged to the hole 49 of the protection cover 12 to lock the protection cover 12.

When to unlock the protection cover 12, the knob 58 is moved with the solenoid 54 into the disengaging direction 55B, in which the movable shaft 53 is engaged to the latch member 48.

During a data reading/writing operation for the portable recording medium 33, the movable shaft 53 can be disengaged from the latch member 48 with an electromagnetic force of the solenoid 54. Accordingly, the knob 58 can be moved without effecting to the latch member 48, which locks the protection cover 12. Therefore, an accidental opening of the protection cover 12 by the knob 58 during a data reading/writing operation for the portable recording medium 33 can be prevented, by which the image processing apparatus 1 and the portable recording medium 33 can be protected from damages such as data damage or OS (operating system) trouble.

Further, before or after a data reading/writing operation for the portable recording medium 33, the movable shaft 53 is engaged to the latch member 48 by setting a power-off condition to the solenoid 54. If the movable shaft 53 is engaged to the latch member 48, the knob 58 is coupled to the latch member 48, in which the knob 58 can be moved in the disengaging direction 55B to disengage the latch member 48 from the hole of the protection cover 12 so that the protection cover 12 is set to an openable condition.

In an example embodiment, the protection cover 12 and the locking unit are provided to restrict an accidental removable of removable memory medium during a data processing for the removable memory medium to prevent data damage or OS (operating system) trouble.

Furthermore, in case of emergency, a removable memory medium can be removed by a mechanical procedure using a bar as above described, by which a portable recording medium can be removed from an image processing apparatus even if a malfunction may occur to the image processing apparatus, or at the time of the power failure, for example.

Although an image processing apparatus is used to describe a configuration for a locking unit and a removable memory medium in the above described example embodiments, the above described locking units can be employed to other apparatuses such as data processing apparatus which can be attached with a removable memory medium.

Numerous additional modifications and variations are possible in light of the above teachings. It is therefore to be understood that within the scope of the appended claims, the disclosure of the present invention may be practiced otherwise than as specifically described herein.

What is claimed is:

1. A data processing apparatus, comprising:

a protection cover configured to cover a removable recording medium attached to the data processing apparatus, the protection cover having a receiving portion;

a latch member configured to engage the receiving portion of the protection cover to set the protection cover in a closed condition;

a control unit configured to control a coupling condition of the latch member and the receiving portion of the protection cover, the control unit selectively transmitting a first signal for engaging the latch member and the receiving portion and a second signal for disengaging the latch member and the receiving portion depending on whether or not data processing for the removable recording medium is in progress;

an electromagnetic device having a movable shaft integrated with the latch member; and an outer cover including an aperture, wherein the latch member and the electromagnetic device are disposed inside the outer cover, the electromagnetic device is moveable with an external force applied by a bar inserted through the aperture, and the external force is used to disengage the latch member from the receiving portion of the protection cover.

2. The data processing apparatus according to claim 1, wherein the electromagnetic device is configured to move the latch member in a reciprocating manner when engaging and disengaging the latch member and the receiving portion of the protection cover.

3. The data processing apparatus according to claim 2, wherein the latch member is biased in one direction to engage the receiving portion of the protection cover when the electromagnetic device is not supplied with power, and the latch member is disengaged from the receiving portion of the protection cover when the electromagnetic device is supplied with power.

4. The data processing apparatus according to claim 1, wherein the electromagnetic device is provided with a fulcrum shaft, the latch member and the electromagnetic device are pivotable at the fulcrum shaft, the receiving portion of the protection cover is elongated in a pivot direction of the latch member, and the pivot direction of the latch member is substantially perpendicular to a reciprocating movement direction of the latch member.

5. A data processing apparatus, comprising:

a protection cover configured to cover a removable recording medium attached to the data processing apparatus, the protection cover having a receiving portion;

a latch member configured to engage the receiving portion of the protection cover to set the protection cover in a closed condition;

a biasing member configured to bias the latch member toward the receiving portion of the protection cover to engage the latch member to the receiving portion;

a latch member stopper configured to stop a movement of the latch member biased by the biasing member at an engaging position with the receiving portion of the protection cover;

a guiding unit configured to guide the latch member when engaging the latch member to the receiving portion of the protection cover, and to guide the latch member when disengaging the latch member from the receiving portion of the protection cover; and an outer cover including an aperture, wherein the latch member and an electromagnetic device are disposed inside the outer cover, the electromagnetic device is moveable with an external force applied by a bar inserted through the aperture, and the external force is used to disengage the latch member from the receiving portion of the protection cover.

6. The data processing apparatus according to claim 5, further comprising a pushing unit configured to push the latch member when disengaging the latch member from the receiving portion.

7. The data processing apparatus according to claim 5, wherein the latch member is a reciprocally-movable member engageable with the protection cover, the latch member being provided under the protection cover, and the latch member moving in a reciprocal manner when engaging or disengaging the protection cover.

8. The data processing apparatus according to claim 5, wherein the electromagnetic device includes a movable shaft and is configured to move the movable shaft in a reciprocating manner to regulate a movement of the latch member, and wherein the electromagnetic device moves the movable shaft to lock the latch member when the latch member engages the receiving portion of the protection cover.

* * * * *